United States Patent
Yang et al.

(10) Patent No.: US 11,854,852 B2
(45) Date of Patent: Dec. 26, 2023

(54) SUBSTRATE CHUCK FOR SELF-ASSEMBLING SEMICONDUCTOR LIGHT-EMITTING DIODES

(71) Applicant: LG ELECTRONICS INC., Seoul (KR)

(72) Inventors: Inbum Yang, Seoul (KR); Junghun Rho, Seoul (KR); Imdeok Jung, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 783 days.

(21) Appl. No.: 16/818,222

(22) Filed: Mar. 13, 2020

(65) Prior Publication Data

US 2021/0090928 A1 Mar. 25, 2021

(30) Foreign Application Priority Data

Sep. 19, 2019 (KR) .................. 10-2019-0115574
Sep. 27, 2019 (KR) .................. 10-2019-0120057

(51) Int. Cl.
*H01L 21/68* (2006.01)
*H01L 21/677* (2006.01)
(Continued)

(52) U.S. Cl.
CPC ........ *H01L 21/68* (2013.01); *H01L 21/67709* (2013.01); *H01L 25/0753* (2013.01); *H01L 33/0095* (2013.01); *H01L 2933/005* (2013.01)

(58) Field of Classification Search
CPC ............ H01L 21/68; H01L 21/67709; H01L 25/0753; H01L 33/0095; H01L 2933/005;
(Continued)

(56) References Cited

U.S. PATENT DOCUMENTS 6,333,522 B1  12/2001  Inoue et al.
9,825,202 B2  11/2017  Schuele et al.
(Continued)

FOREIGN PATENT DOCUMENTS

CN  104658884 A  5/2015
CN  108682312 A  10/2018
(Continued)

OTHER PUBLICATIONS

U.S. Appl. No. 16/857,818, filed Apr. 24, 2020, 2812.
(Continued)

*Primary Examiner* — Ermias T Woldegeorgis
(74) *Attorney, Agent, or Firm* — Birch, Stewart, Kolasch & Birch, LLP

(57) ABSTRACT

Discussed is a substrate chuck including: a substrate support part for supporting a substrate having an assembly electrode; a vertical moving part which moves the substrate so that one surface of the substrate comes in contact with a fluid in a state in which the substrate is supported by the substrate support; an electrode connection part for applying power to the assembly electrode to generate an electric field so that semiconductor light-emitting diodes are placed at the predetermined positions of the substrate in a process of moving the semiconductor light-emitting diodes by a position change of at least one magnet; and a rotating part for rotating the substrate support part around a rotating shaft so that the substrate is placed in an upward or downward direction, wherein the rotating shaft is spaced apart from a center of the substrate support part at a predetermined distance.

18 Claims, 25 Drawing Sheets

(51) Int. Cl.
  *H01L 25/075* (2006.01)
  *H01L 33/00* (2010.01)
(58) Field of Classification Search
  CPC ....... H01L 2224/756; H01L 2224/7565; H01L 2224/75705; H01L 2224/75735; H01L 2224/75822; H01L 2224/75823; H01L 2224/75824; H01L 2224/7598; H01L 2224/95; H01L 2224/95085; H01L 2224/95101; H01L 2224/95133; H01L 2224/95136; H01L 2224/95144; H01L 2224/95145; H01L 2224/95146; H01L 2224/95148; H01L 2924/3511; H01L 24/75; H01L 24/95; H01L 21/6835; H01L 27/156; H01L 2221/68368
  See application file for complete search history.

(56) References Cited

U.S. PATENT DOCUMENTS

| | | |
|---|---|---|
| 2006/0196415 A1 | 9/2006 | Lee et al. |
| 2008/0218299 A1 | 9/2008 | Arnold |
| 2009/0265929 A1 | 10/2009 | Nakagawa et al. |
| 2011/0179640 A1 | 7/2011 | Arnold et al. |
| 2011/0277937 A1 | 11/2011 | Nakagawa |
| 2012/0291950 A1* | 11/2012 | Sugiyama ........... H01L 21/6835 156/60 |
| 2013/0302935 A1 | 11/2013 | Dai et al. |
| 2014/0097088 A1 | 4/2014 | Stowell et al. |
| 2015/0138494 A1 | 5/2015 | Kim et al. |
| 2015/0228622 A1* | 8/2015 | Koyanagi ............... H01L 24/83 257/777 |
| 2016/0126049 A1 | 5/2016 | Ahn et al. |
| 2016/0155892 A1 | 6/2016 | Li et al. |
| 2017/0229330 A1 | 8/2017 | Tkachenko et al. |
| 2018/0012873 A1 | 1/2018 | Lee et al. |
| 2018/0033986 A1 | 2/2018 | Takai et al. |
| 2018/0102352 A1 | 4/2018 | Sasaki et al. |
| 2018/0158713 A1 | 6/2018 | Okita et al. |
| 2018/0190814 A1 | 7/2018 | Kumar et al. |
| 2018/0012421 A1 | 11/2018 | Garner et al. |
| 2019/0058080 A1 | 2/2019 | Ahmed et al. |

FOREIGN PATENT DOCUMENTS

| | | | |
|---|---|---|---|
| DE | 10 2016 011 747 A1 | | 3/2018 |
| JP | 7-297210 A | | 11/1995 |
| JP | 2003-129297 A | | 5/2003 |
| JP | 2005-326873 A | | 11/2005 |
| JP | 2011-211136 A | | 10/2011 |
| JP | 2017-71224 A | | 4/2017 |
| JP | 2017-539097 A | | 12/2017 |
| KR | 10-2006-0000704 A | | 1/2006 |
| KR | 10-0928951 B1 | | 11/2009 |
| KR | 10-2015-0005628 A | | 1/2015 |
| KR | 10-2017-0071514 A | | 6/2017 |
| KR | 10-2018-0001472 A | | 1/2018 |
| KR | 10-2018-0115584 A | | 10/2018 |
| KR | 10-2019-0017691 A | | 2/2019 |
| KR | 10-2019-0018385 A | | 2/2019 |
| KR | 10-2019-0085892 A | | 7/2019 |
| KR | 10-2019-0097946 A | | 8/2019 |
| KR | 10-2019-0099164 A | | 8/2019 |
| KR | 10-2019-0105537 A | | 9/2019 |
| KR | 10-2020-0014865 A | | 2/2020 |
| KR | 10-2020-0026761 A | | 3/2020 |
| WO | WO 2008/054326 A1 | | 5/2008 |
| WO | WO 2011/114741 A1 | | 9/2011 |

OTHER PUBLICATIONS

U.S. Appl. No. 16/842,323, filed Apr. 7, 2020, 3600.
U.S. Appl. No. 16/818,469, filed Mar. 13, 2020, 2812.
U.S. Appl. No. 16/818,296, filed Mar. 13, 2020, 2812.
U.S. Appl. No. 16/842,347, filed Apr. 7, 2020, 3729.
Written Opinion of the International Searching Authority and International Search Report, dated Jun. 17, 2020, for International Application No. PCT/KR2019/012908.
Written Opinion of the International Searching Authority and International Search Report, dated Jun. 19, 2020, for International Application No. PCT/KR2019/012912.
Written Opinion of the International Searching Authority and International Search Report, dated Jun. 17, 2020, for International Application No. PCT/KR2019/002303.
Written Opinion of the International Searching Authority and International Search Report, dated Jun. 17, 2020, for International Application No. PCT/KR2019/002361.
Written Opinion of the International Searching Authority and International Search Report, dated Jun. 17, 2020, for International Application No. PCT/KR2020/002362.
Korean Office Action, dated Feb. 16, 2021, for Korean Application No. 10-2019-0115574.
Korean Office Action, dated Mar. 8, 2021, for Korean Application No. 10-2019-0120057.

* cited by examiner

SUBSTRATE CHUCK FOR SELF-ASSEMBLING SEMICONDUCTOR LIGHT-EMITTING DIODES

CROSS-REFERENCE TO RELATED APPLICATION

Pursuant to 35 U.S.C. § 119(a), this application claims the benefit of earlier filing date and right of priority to Korean Patent Application Nos. 10-2019-0115574, filed on Sep. 19, 2019 and 10-2019-0120057, filed on Sep. 27, 2019, the contents of all these applications are incorporated by reference herein in their entirety.

BACKGROUND OF THE INVENTION

1. Field of the Invention

The present disclosure relates to a method for manufacturing a display device, and more particularly, to a substrate chuck for self-assembling microLEDs.

2. Description of the Related Art

In recent years, in the field of display technology, liquid-crystal displays (LCD), organic light-emitting diode (OLED) displays, microLED displays, etc. have been competing to realize large-area displays.

Meanwhile, semiconductor light-emitting diodes (microLEDs (μLED)) with a diameter or cross-sectional area less than 100 microns, when used in displays, can offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick and place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing displays by the self-assembly of microLEDs. In view of this, the present disclosure proposes a new manufacturing device for self-assembling microLEDs.

SUMMARY OF THE INVENTION

One aspect of the present disclosure is to provide a new manufacturing process that provides high reliability in large-screen displays using micro-size semiconductor light-emitting diodes.

Another aspect of the present disclosure is to provide a substrate chuck capable of removing bubbles formed between a substrate and a fluid when a semiconductor light-emitting diode is self-assembled to a temporary substrate or a wiring substrate.

Still another aspect of the present disclosure is to provide a substrate chuck capable of preventing the previously assembled semiconductor light-emitting diode from being separated from the substrate when the substrate is separated from the fluid after the substrate is self-assembled.

Still another aspect of the present disclosure is to provide a substrate chuck capable of preventing the substrate from being broken due to buoyancy applied to the substrate during self-assembly.

In order to achieve the above object, the present disclosure provides a substrate chuck for placing a semiconductor light-emitting diode dispersed in a fluid at a predetermined position of a substrate. The substrate chuck can include a substrate support part for supporting a substrate having an assembly electrode, a vertical moving part which lowers the substrate such that one surface of the substrate is in contact with the fluid in a state in which the substrate is supported, an electrode connection part for applying a power to the assembly electrode to generate an electric field such that the semiconductor light-emitting diodes are placed at a predetermined position of the substrate in a process of moving the semiconductor light-emitting diodes by a position change of the magnets, and a rotating part for rotating the substrate support part around a rotating shaft such that the substrate is toward an upward or downward direction, wherein the rotating shaft can be spaced apart from a center of the substrate support part at a predetermined distance.

In one embodiment, the rotating shaft can be positioned at an end portion of the substrate support part.

In one embodiment, the substrate support part can include first and second frames for fixing the substrate in both directions and a fixing part having a sidewall part for fixing the first and second frames, wherein the rotating shaft can be disposed at one end of the sidewall part of the fixing part.

In one embodiment, a frame moving part disposed at the fixing part and vertically moving the second frame is included, wherein the frame moving part can move vertically at least one of the first and second frames such that the first and second frames press the substrate in a state in which the substrate is loaded.

In one embodiment, a protrusion for guiding an alignment position of the substrate can be formed at at least one of the first and second frames.

In one embodiment, each of the first and second frames can include a bottom portion in contact with the substrate, and a hole disposed in a center of the bottom portion and exposing one surface of the substrate to the outside.

In one embodiment, the bottom portion provided at the second frame can be formed to be in contact with an entire edge of one surface of both surfaces of the substrate in a state in which the first and second frames press the substrate.

In one embodiment, a sealing part disposed in the bottom portion provided at the first frame can be further included, wherein the sealing part can be formed to be in contact with an entire edge of another surface of both surfaces of the substrate in the state in which the first and second frames press the substrate.

In one embodiment, the present disclosure can further include an auxiliary clamp for fixing at least one of the second frame and the substrate in a state in which the second frame presses the substrate.

In one embodiment, a displacement sensor disposed at the fixing part and measuring a distance from a measurement target object and a sensor transfer part disposed at the sidewall part of the fixing part and moving the displacement sensor with respect to the substrate, horizontally can be further included.

With the above configuration according to the present disclosure, large numbers of semiconductor light-emitting diodes can be assembled at a time on a display device where individual pixels are made up of microLEDs.

As such, according to the present disclosure, large numbers of semiconductor light-emitting diodes can be pixelated on a small-sized wafer and then transferred onto a large-area substrate. This enables the manufacture of a large-area display device at a low cost.

Moreover, according to the present disclosure, a low-cost, high-efficiency, and quick transfer of semiconductor light-emitting diodes can be done, regardless of the sizes or numbers of parts and the transfer area, by transferring them in the right positions in a solution by using a magnetic field and an electric field.

Furthermore, the assembling of semiconductor light-emitting diodes by an electric field allows for selective assembling through selective electrical application without any additional equipment or processes. Also, since an assembly substrate is placed on top of a chamber, the substrate can be easily loaded or unloaded, and non-specific binding of semiconductor light-emitting diodes can be prevented.

When the substrate is in contact with the fluid, the substrate is obliquely in contact with the fluid, and thus the present disclosure allows bubbles to be pushed out of an edge of the substrate and removed. Accordingly, the present disclosure prevents a self-assembly yield from being lowered due to the bubbles.

In addition, the substrate is obliquely separated from the fluid after the self-assembly is completed, and thus the present disclosure minimizes surface energy acting between the substrate and the fluid. Accordingly, the present disclosure prevents the previously assembled semiconductor light-emitting diode from being separated from the substrate.

Further, an entire edge of the substrate during self-assembly is fixed strongly, and thus the present disclosure prevents the substrate from breaking due to buoyancy acting on the substrate.

DETAILED DESCRIPTION OF THE PREFERRED EMBODIMENTS

Description will now be given in detail according to example embodiments disclosed herein, with reference to the accompanying drawings. For the sake of brief description with reference to the drawings, the same or equivalent components can be provided with the same or similar reference numbers, and description thereof will not be repeated. In general, a suffix such as "module" and "unit" can be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings.

Also, It will be understood that when an element, such as a layer, area or substrate is referred to as being "disposed on" another element, the element can be disposed directly on the another element or there are no intervening elements present.

Mobile terminals described herein can include cellular phones, smart phones, laptop computers, digital broadcasting terminals, personal digital assistants (PDAs), portable multimedia players (PMPs), navigators, slate PCs, tablet PC, ultra books, digital TVs, digital signage, head-mounted displays (HMDs), desk top computers and the like. However, it can be easily understood by those skilled in the art that the configuration according to the example embodiments of this specification can also be applied to any device capable of displaying information even though such device is a new type of product to be developed.

Figure 1:
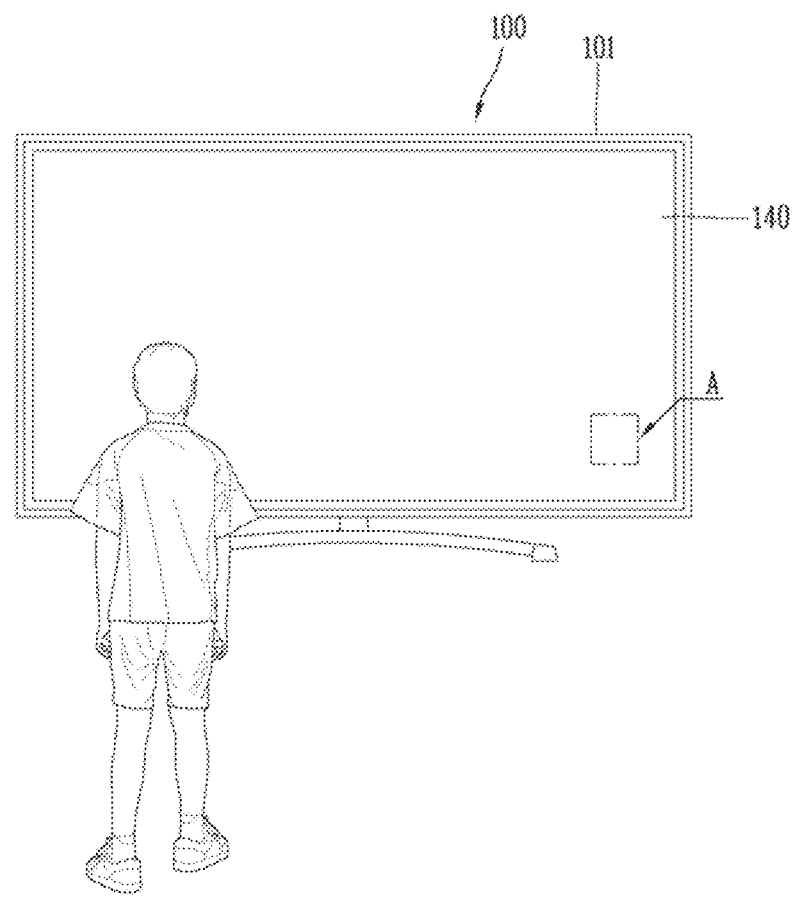
FIG. 1 is a conceptual diagram showing one embodiment of a display device using semiconductor light-emitting diodes according to the present disclosure.
Figure 2:
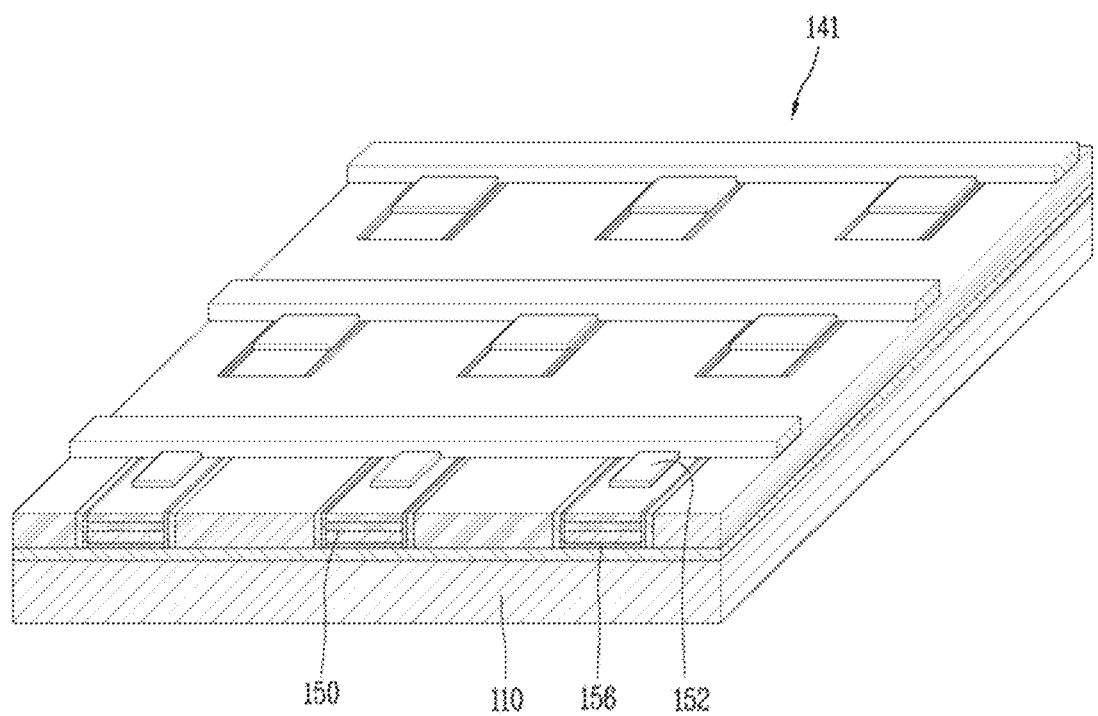
FIG. 2 is a partial enlarged view of the portion A in the display device of FIG. 1.
Figure 3:
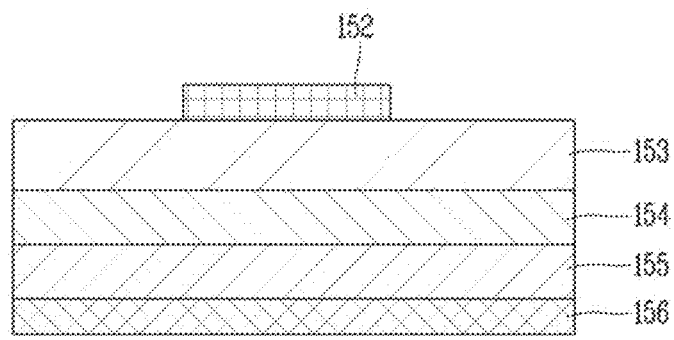
FIG. 3 is an enlarged view of the semiconductor light-emitting diodes of FIG. 2.
Figure 4:
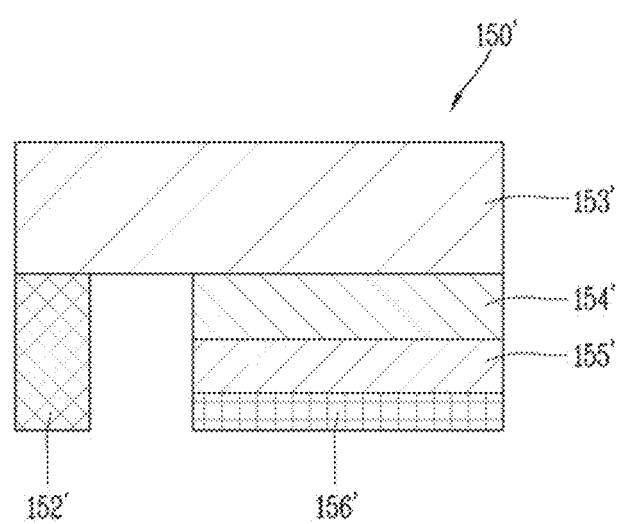
FIG. 4 is an enlarged view showing another embodiment of the semiconductor light-emitting diodes of FIG. 2.

FIG. 1 is a conceptual diagram showing one embodiment of a display device using semiconductor light-emitting diodes according to the present disclosure. FIG. 2 is a partial enlarged view of the portion A in the display device of FIG. 1. FIG. 3 is an enlarged view of the semiconductor light-emitting diodes of FIG. 2. FIG. 4 is an enlarged view showing another embodiment of the semiconductor light-emitting diodes of FIG. 2.

According to the illustration, information processed by a controller of a display device 100 can be outputted by a display module 140. A closed loop-shaped case 101 that runs around the edge of the display module can form the bezel of the display device.

The display module 140 comes with a panel 141 that displays an image, and the panel 141 can come with micro-sized semiconductor light-emitting diodes 150 and a wiring substrate 110 where the semiconductor light-emitting diodes 150 are mounted.

The wiring substrate 110 can be formed with wiring lines, which can be connected to n-type electrodes 152 and p-type electrodes 156 of the semiconductor light-emitting diodes 150. As such, the semiconductor light-emitting diodes 150 can be provided on the wiring substrate 110 as individual pixels that emit light on their own.

The image displayed on the panel 141 is visual information, which is rendered by controlling the light emission of unit pixels (sub-pixels) arranged in a matrix independently through the wiring lines.

The present disclosure takes microLEDs (light-emitting diodes) as an example of the semiconductor light-emitting diodes 150 which convert current into light. The microLEDs can be light-emitting diodes that are small in size—less than 100 microns. The semiconductor light-emitting diodes 150 have light-emitting regions of red, green, and blue, and unit pixels can produce light through combinations of these colors. That is, the unit pixels are the smallest units for producing one color. Each unit pixels can contain at least three microLEDs.

More specifically, referring to FIG. 3, the semiconductor light-emitting diodes 150 can have a vertical structure.

For example, the semiconductor light-emitting diodes 150 can be implemented as high-power light-emitting diodes that are composed mostly of gallium nitride (GaN), with some indium (In) and/or aluminum (Al) added to it, and emit light of various colors.

Such a vertical semiconductor light-emitting diode comprises a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom can be electrically connected to a p electrode of the wiring substrate, and the n-type electrode 152 at the top can be electrically connected to an n electrode above the semiconductor light-emitting diode. One of the biggest advantages of the vertical semiconductor light-emitting diode 150 is that the chip size can be reduced by vertically aligning electrodes.

In another example, referring to FIG. 4, the semiconductor light-emitting diodes can be flip chip-type light-emitting diodes.

As an example of such a flip chip-type light-emitting diode, the semiconductor light-emitting diode 150' comprises a p-type electrode 156', a p-type semiconductor layer 155' formed on the p-type electrode 156', an active layer 154' formed on the p-type semiconductor layer 155', an n-type semiconductor layer 153' formed on the active layer 154', and an n-type electrode 152' vertically separated from the p-type electrode 156', on the n-type semiconductor layer 153'. In this case, both the p-type electrode 156' and the n-type electrode 152' can be electrically connected to a p electrode and n electrode of the wiring substrate, below the semiconductor light-emitting diode.

The vertical semiconductor light-emitting diode and a horizontal light-emitting diode each can be used as a green semiconductor light-emitting diode, blue semiconductor light-emitting diode, or red semiconductor light-emitting diode. The green semiconductor light-emitting diode and the blue semiconductor light-emitting diode can be implemented as high-power light-emitting diodes that are composed mostly of gallium nitride (GaN), with some indium (In) and/or aluminum (Al) added to it, and emit green and blue light, respectively. As an example of such high-power light-emitting diodes, the semiconductor light-emitting diodes can be composed of gallium nitride thin films which are formed of various layers of n-Gan, p-GaN, AlGaN, InGaN, etc. More specifically, the p-type semiconductor layer can be P-type GaN, and the n-type semiconductor layer can be N-type GaN.

Moreover, the p-type semiconductor layer can be P-type GaN doped with Mg on the p electrode, and the n-type semiconductor layer can be N-type GaN doped with Si on the n electrode. In this case, the above-described semiconductor light-emitting diodes can come without the active layer.

Meanwhile, referring to FIGS. 1 to 4, because of the very small size of the light-emitting diodes, self-emissive, high-definition unit pixels can be arranged on the display panel, and therefore the display device can deliver high picture quality.

In the above-described display device using semiconductor light-emitting diodes according to the present disclosure, semiconductor light-emitting diodes are grown on a wafer, formed through mesa and isolation, and used as individual pixels. In this case, the micro-sized semiconductor light-emitting diodes 150 should be transferred onto a wafer, at preset positions on a substrate of the display panel. One of the transfer technologies available is pick and place, but it has a low success rate and requires a lot of time. In another example, a number of diodes can be transferred at a time by using a stamp or roll, which, however, is not suitable for large-screen displays because of limited yields. The present disclosure suggests a new method and device for manufacturing a display device that can improve on these problems.

To this end, the new method for manufacturing a display device will be described first below. FIGS. 5A to 5E are conceptual diagrams for explaining a new process for manufacturing the above-described semiconductor light-emitting diodes.

In this specification, a display device using passive matrix (PM) semiconductor light-emitting diodes will be illustrated. It should be noted that the illustration given below also applies to active matrix (AM) semiconductor light-emitting diodes or other electrical devices. Also, although the illustration will be given of how horizontal semiconductor light-emitting diodes are self-assembled, it also can apply to self-assembling of vertical semiconductor light-emitting diodes or other electrical devices.

Figure 5A:
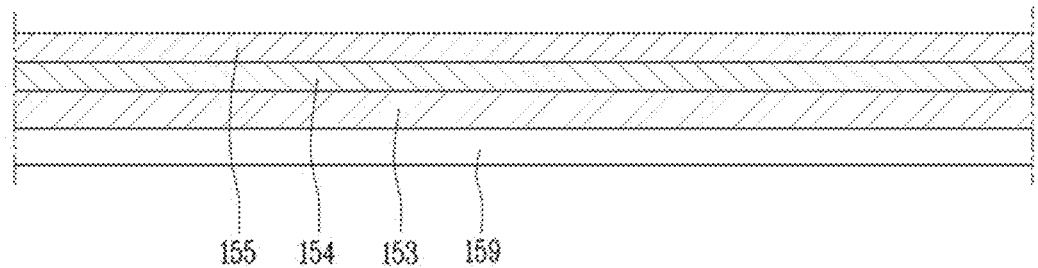
FIGS. 5A to 5E are conceptual diagrams for explaining a new process for manufacturing the above-described semiconductor light-emitting diodes.

First of all, according to the manufacturing method, a first conductive semiconductor layer 153, an active layer 154, and a second conductive semiconductor layer 155 are grown on a growth substrate 159 (see FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, active layer 154, and second conductive semiconductor layer 155, the first conductive semiconductor layer 153, active layer 154, and second conductive semiconductor layer 155 form a stack structure as shown in FIG. 5A.

In this case, the first conductive semiconductor layer 153 can be a p-type semiconductor layer, and the second conductive semiconductor layer 155 can be an n-type semiconductor layer. However, the present disclosure is not necessarily limited to this, and the first conductive type can be n-type and the second conductive type can be p-type.

Moreover, although this example embodiment is illustrated by assuming the presence of the active layer, the active layer can be omitted if necessary or desired, as stated above. In an example, the p-type semiconductor layer can be P-type GaN doped with Mg, and the n-type semiconductor layer can be N-type GaN doped with Si on the n electrode.

The growth substrate 159 (e.g., wafer) can be formed of, but not limited to, light-transmissive material—for example, at least one among sapphire ($Al_2O_3$), GaN, ZnO, and AlO. Also, the growth substrate 159 can be made from a material suitable for growing semiconductor materials or carrier wafer. The growth substrate 159 can be formed of high thermal conducting material, and can be a conductive substrate or insulating substrate—for example, at least one among SiC, Si, GaAs, GaP, InP, and $Ga_2O_3$ substrates which have higher thermal conductivity than sapphire ($Al_2O_3$) substrates.

Figure 5B:
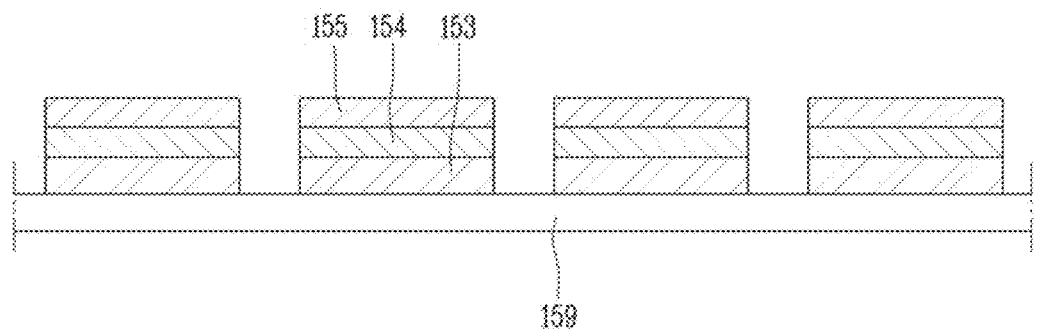

Next, a plurality of semiconductor light-emitting diodes are formed by removing at least part of the first conductive semiconductor layer 153, active layer 154, and second conductive semiconductor layer 155 (see FIG. 5B).

More specifically, isolation is performed so that the light-emitting diodes form a light-emitting diode array. That is, a plurality of semiconductor light-emitting diodes are formed by vertically etching the first conductive semiconductor layer 153, active layer 154, and second conductive semiconductor layer 155.

In the case of horizontal semiconductor light-emitting diodes, a mesa process can be performed which exposes the first conductive semiconductor layer 153 to the outside by vertically removing part of the active layer 154 and second conductive layer 155, and then isolation can be performed which forms an array of semiconductor light-emitting diodes by etching the first conductive semiconductor layer 153.

Figure 5C:
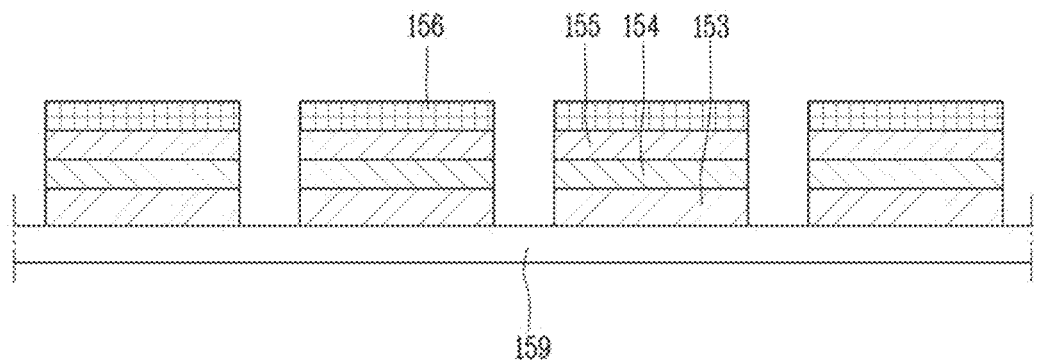
Figure 5D:
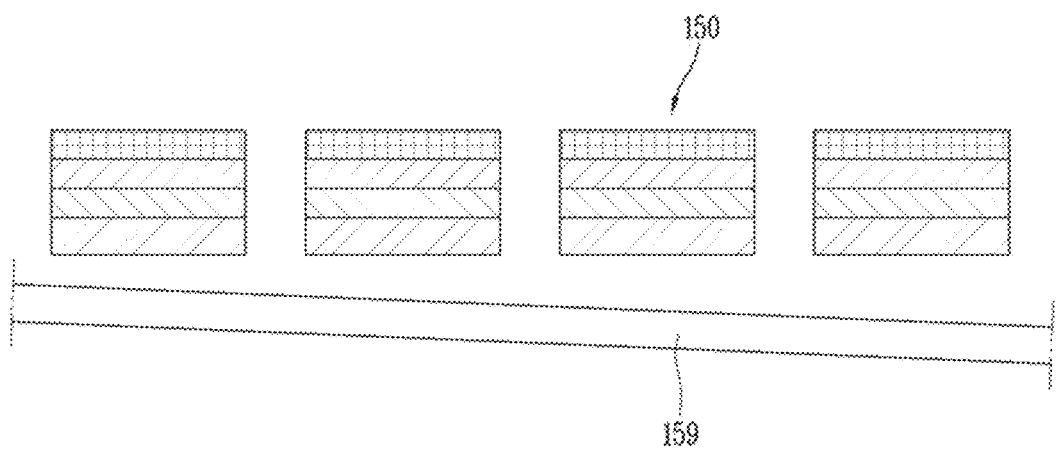

Next, a second conductive electrode 156 (or p-type electrode) is formed on one surface of the second conductive semiconductor layer 155 (see FIG. 5C). The second conductive electrode 156 can be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 can serve as an n-type electrode.

Next, the growth substrate 159 is removed, thus leaving a plurality of semiconductor light-emitting diodes. For example, the growth substrate 159 can be removed using laser lift-off (LLO) or chemical lift-off (CLO) (see FIG. 5D).

Figure 5E:
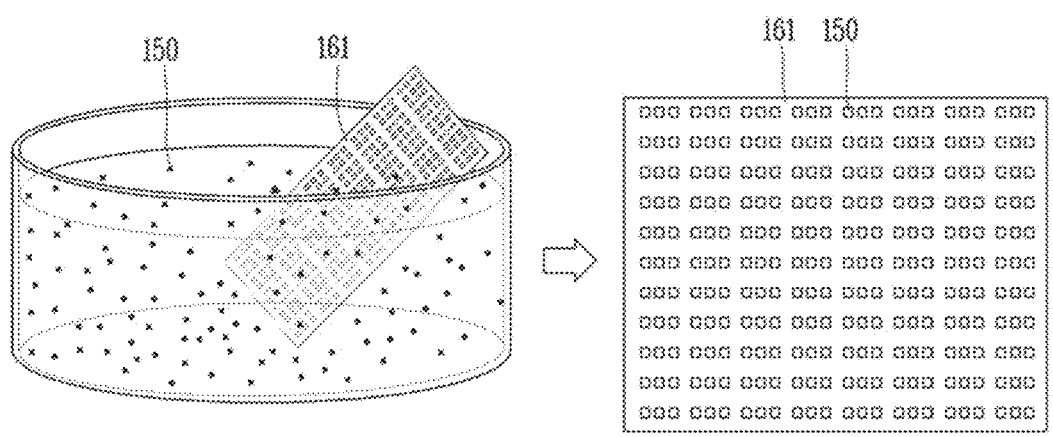

Afterwards, the step of mounting the semiconductor light-emitting didoes 150 on a substrate in a chamber filled with a fluid is performed (see FIG. 5E).

For example, the semiconductor light-emitting diodes 150 and the substrate are put into the chamber filled with a fluid, and the semiconductor light-emitting diodes are self-assembled onto the substrate 161 using fluidity, gravity, surface tension, etc. In this case, the substrate can be an assembly substrate 161.

In another example, a wiring substrate, instead of the assembly substrate 161, can be put into an assembly chamber, and the semiconductor light-emitting diodes 150 can be mounted directly onto the wiring substrate. In this case, the substrate can be a wiring substrate. For convenience of explanation, the present disclosure is illustrated with an example in which the semiconductor light-emitting diodes 150 are mounted onto the assembly substrate 161.

To facilitate the mounting of the semiconductor light-emitting diodes 150 onto the assembly substrate 161, cells into which the semiconductor light-emitting diodes 150 are fitted can be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting diodes 150 are assembled to the cells as they move within the fluid.

After arraying the semiconductor light-emitting didoes on the assembly substrate 161, the semiconductor light-emitting diodes can be transferred to the wiring substrate from the assembly substrate 161, thereby enabling a large-area transfer across a large area. Thus, the assembly substrate 161 can be referred to as a temporary substrate.

Meanwhile, the above-described self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more details below with reference to the accompanying drawings.

Figure 6:
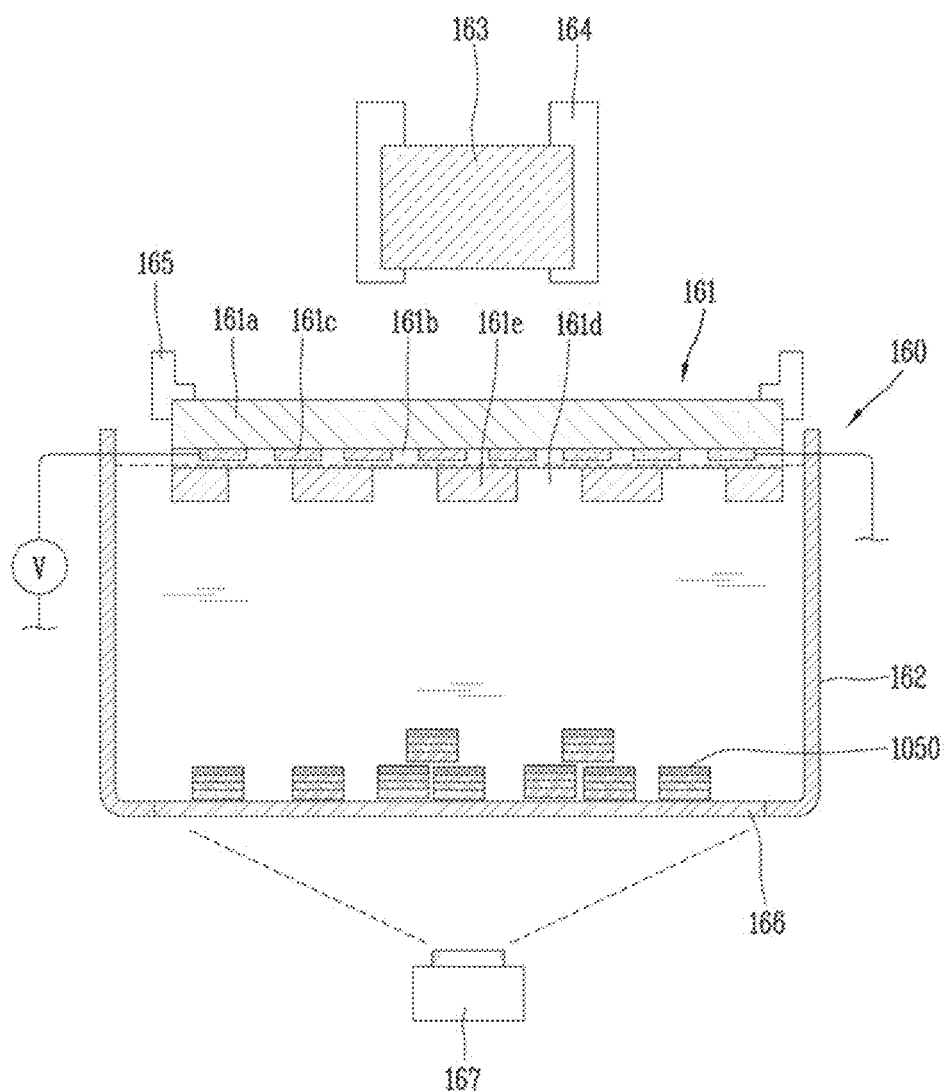
FIG. 6 is a conceptual diagram showing an example of a device for self-assembling semiconductor light-emitting diodes according to the present disclosure.
Figure 7:
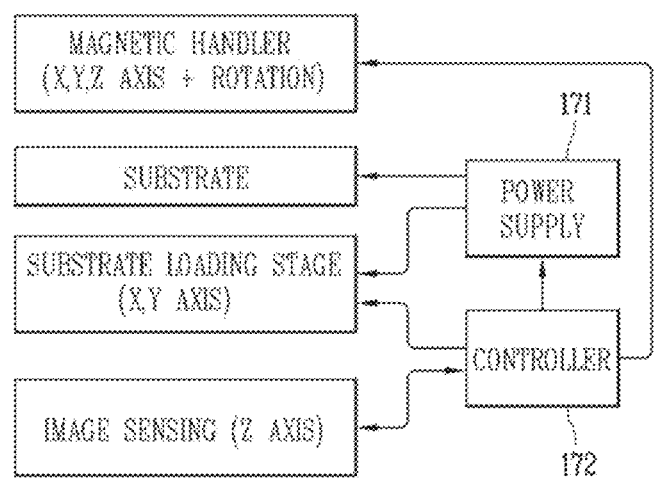
FIG. 7 is a block diagram of the self-assembly device of FIG. 6.

FIG. 6 is a conceptual diagram showing an example of a device for self-assembling semiconductor light-emitting diodes according to the present disclosure. FIG. 7 is a block diagram of the self-assembly device of FIG. 6. FIGS. 8A to 8E are conceptual diagrams showing a process for self-assembling semiconductor light-emitting diodes using the self-assembly device of FIG. 6. FIG. 9 is a conceptual diagram for explaining the semiconductor light-emitting diodes of FIGS. 8A to 8E.

Referring to FIGS. 6 and 7, the self-assembly device 160 of the present disclosure can comprise an assembly chamber 162, magnets 163, and a position controller 164.

The assembly chamber 162 is equipped with space for a plurality of semiconductor light-emitting diodes. The space can be filled with a fluid, and the fluid can be an assembly solution, which includes water or the like. Thus, the assembly chamber 162 can be a water tank and configured as open-type. However, the present disclosure is not limited to this, and the assembly chamber 162 can be a closed-type chamber that comes with a closed space.

A substrate 161 can be placed in the assembly chamber 162 so that an assembly surface where the semiconductor light-emitting diodes 150 are assembled faces downwards. For example, the substrate 161 is fed to an assembly site by a feed unit, and the feed unit can come with a stage 165 where the substrate is mounted. The position of the stage 165 can be adjusted by the controller, whereby the substrate 161 can be fed to the assembly site.

In this instance, the assembly surface of the substrate 161 at the assembly site faces the bottom of the assembly chamber 162. As shown in the drawings, the assembly surface of the substrate 161 is placed in such a way as to be soaked with the fluid in the assembly chamber 162. Thus, the semiconductor light-emitting diodes 150 in the fluid are moved to the assembly surface.

The substrate 161 is an assembly substrate where an electric field can be formed, and can comprise a base portion 161a, a dielectric layer 161b, and a plurality of electrodes 161c.

The base portion 161a is made of insulating material, and the electrodes 161c can be thin-film or thick-film bi-planar electrodes that are patterned on one surface of the base portion 161a. The electrodes 161c can be formed of a stack of Ti/Cu/Ti, Ag paste, ITO, etc.

The dielectric layer 161b can be made of inorganic material such as $SiO_2$, SiNx, SiON, $Al_2O_3$, $TiO_2$, $HfO_2$, etc. Alternatively, the dielectric layer 161b can be an organic insulator and composed of a single layer or multi-layers. The thickness of the dielectric layer 161b can range from several tens of nm to several μm.

Further, the substrate 161 according to the present disclosure comprises a plurality of cells 161d that are separated by partition walls 161e. The cells 161d can be sequentially arranged in one direction and made of polymer material. Also, the partition walls 161e forming the cells 161d can be shared with neighboring cells 161d. The partition walls 161e can protrude from the base portion 161a, and the cells 161d can be sequentially arranged in one direction along the partition walls 161e. More specifically, the cells 161d can be sequentially arranged in column and row directions and have a matrix structure.

As shown in the drawings, the cells 161d can have recesses for accommodating the semiconductor light-emitting diodes 150, and the recesses can be spaces defined by the partition walls 161e. The recesses can have a shape identical or similar to the shape of the semiconductor light-emitting diodes. For example, if the semiconductor light-emitting diodes are rectangular, the recesses can be rectangular too. Moreover, the recesses formed in the cells can be circular if the semiconductor light-emitting diodes are circular. Further, each cell is configured to accommodate one semiconductor light-emitting diode. That is, one cell accommodates one semiconductor light-emitting diode.

Meanwhile, the plurality of electrodes 161c have a plurality of electrode lines that are placed at the bottom of the cells 161d, and the electrode lines can be configured to extend to neighboring cells.

The electrodes 161c are placed on the undersides of the cells 161d, and different polarities can be applied to create an electric field within the cells 161d. To form an electric field, the dielectric layer 161b can form the bottom of the cells 161d while covering the electrodes 161c. With this structure, when different polarities are applied to a pair of electrodes 161c on the underside of each cell 161d, an electric field is formed and the semiconductor light-emitting diodes can be inserted into the cells 161d by the electric field.

The electrodes of the substrate 161 at the assembly site are electrically connected to a power supply 171. The power supply 171 performs the function of generating an electric field by applying power to the electrodes.

As shown in the drawings, the self-assembly device can have magnets 163 for applying magnetic force to the semiconductor light-emitting diodes. The magnets 163 are placed at a distance from the assembly chamber 162 and apply a magnetic force to the semiconductor light-emitting diodes 150. The magnets 163 can be placed to face the opposite side of the assembly surface of the substrate 161, and the positions of the magnets 163 are controlled by the position controller 164 connected to the magnets 163.

The semiconductor light-emitting diodes 1050 can have a magnetic material so that they are moved within the fluid by a magnetic field.

Referring to FIG. 9, a semiconductor light-emitting diode having a magnetic material can comprise a first conductive electrode 1052, a second conductive electrode 1056, a first conductive semiconductor layer 1053 where the first conductive electrode 1052 is placed, a second conductive semiconductor layer 1055 which overlaps the first conductive semiconductor layer 1053 and where the second conductive semiconductor layer 1055 is placed, and an active layer 1054 placed between the first and second conductive semiconductor layers 1053 and 1055.

Here, the first conductive can refer to p-type, and the second conductive type can refer to n-type, or vice versa. As stated previously, the semiconductor light-emitting diode can be formed without the active layer.

Meanwhile, in the present disclosure, the first conductive electrode 1052 can be formed after the semiconductor light-emitting diode is assembled onto the wiring substrate by the self-assembling of the semiconductor light-emitting diode. Further, in the present disclosure, the second conductive electrode 1056 can comprise a magnetic material. The magnetic material can refer a magnetic metal. The magnetic material can be Ni, SmCo, etc. In another example, the magnetic material can include at least one among Gd-based, La-based, and Mn-based materials.

The magnetic material can be provided in the form of particles on the second conductive electrode 1056. Alternatively, one layer of a conductive electrode comprising a magnetic material can be composed of the magnetic material. An example of this is the second conductive electrode 1056 of the semiconductor light-emitting diode 1050 which comprises a first layer 1056a and a second layer 1056b, as shown in FIG. 9. Here, the first layer 1056a can comprise a magnetic material, and the second layer 1056b can comprise a metal material other than the magnetic material.

As shown in the drawing, in this example, the first layer 1056a comprising the magnetic material can be placed in contact with the second conductive semiconductor layer 1055. In this case, the first layer 1056a is placed between the second layer 1056b and the second conductive semiconductor layer 1055. The second layer 1056b can be a contact metal that is connected to the wiring electrode on the wiring substrate. However, the present disclosure is not necessarily limited to this, and the magnetic material can be placed on one surface of the first conductive semiconductor layer.

Referring again to FIGS. 6 and 7, more specifically, on top of the assembly chamber of the self-assembly device, a magnet handler (or magnetic handler) capable of automatically or manually moving the magnets 163 on the x, y, and z axes or a motor capable of rotating the magnets 163 can be provided. The magnet handler and motor can constitute the position controller 164. As such, the magnets 163 can rotate in a horizontal, clockwise, or counterclockwise direction to the substrate 161.

Meanwhile, the assembly chamber 162 can be formed with a light-transmissive bottom plate 166, and the semiconductor light-emitting diodes can be placed between the bottom plate 166 and the substrate 161. An image sensor 167 can be placed opposite to the bottom plate 166 so as to monitor the inside of the assembly chamber 162 through the bottom plate 166. The image sensor 167 can be controlled by a controller 172, and can come with an inverted-type lens, CCD, etc. so as to observe the assembly surface of the substrate 161.

The above-described self-assembly device is configured to use a magnetic field and an electric field in combination. With this, the semiconductor light-emitting diodes are mounted at preset positions on the substrate by an electric field while in the process of being moved by changes in the positions of the magnets. Below, the assembly process using the above-described self-assembly device will be described in more details.

First of all, a plurality of semiconductor light-emitting diodes 1050 having a magnetic material can be formed through the process explained with reference to FIGS. 5A to 5C. In this case, the magnetic material can be deposited onto the semiconductor light-emitting didoes in the process of forming the second conductive electrode of FIG. 5C.

Figure 8A:
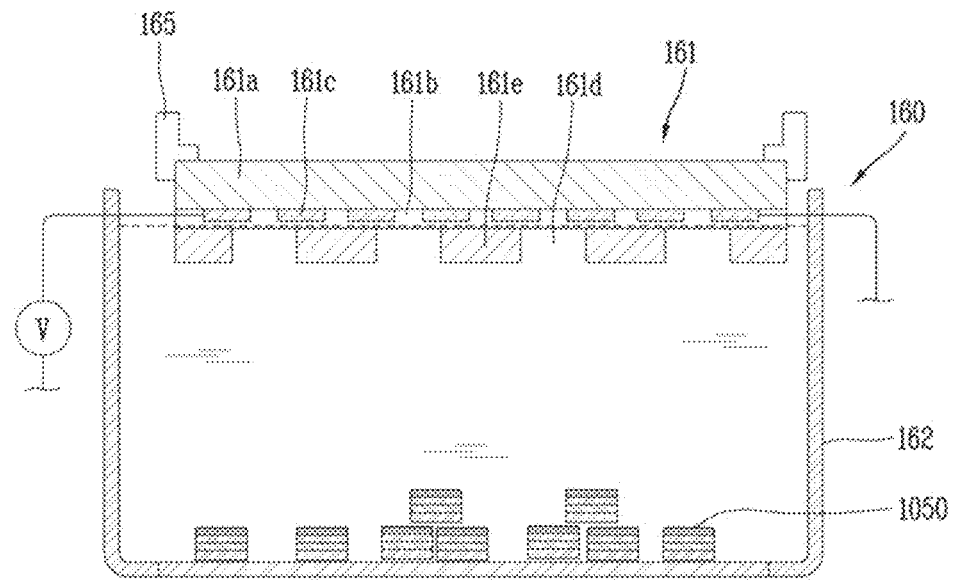
FIGS. 8A to 8E are conceptual diagrams showing a process for self-assembling semiconductor light-emitting diodes using the self-assembly device of FIG. 6.
Figure 9:
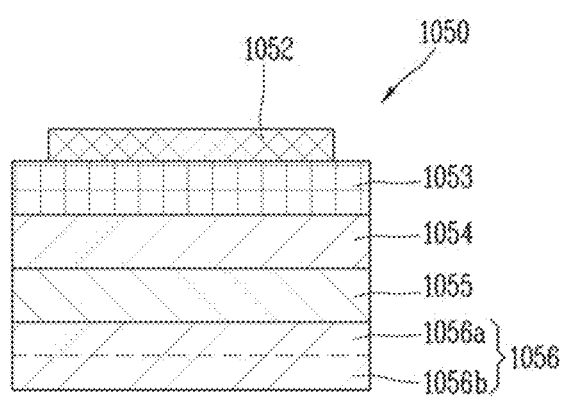
FIG. 9 is a conceptual diagram for explaining the semiconductor light-emitting diodes of FIGS. 8A to 8E.

Next, the substrate 161 is fed to an assembly site, and the semiconductor light-emitting diodes 1050 are put into the assembly chamber 162 (see FIG. 8A).

As described above, the assembly site on the substrate 161 can be a position at which the substrate 161 is placed in the assembly chamber 162 in such a way that an assembly surface where the semiconductor light-emitting diodes 150 are assembled faces downwards.

In this case, some of the semiconductor light-emitting diodes 1050 can sink to the bottom of the assembly chamber 162 and some of them can float in the fluid. If the assembly chamber 162 comes with a light-transmissive bottom plate 166, some of the semiconductor light-emitting diodes 1050 can sink to the bottom plate 166.

Figure 8B:
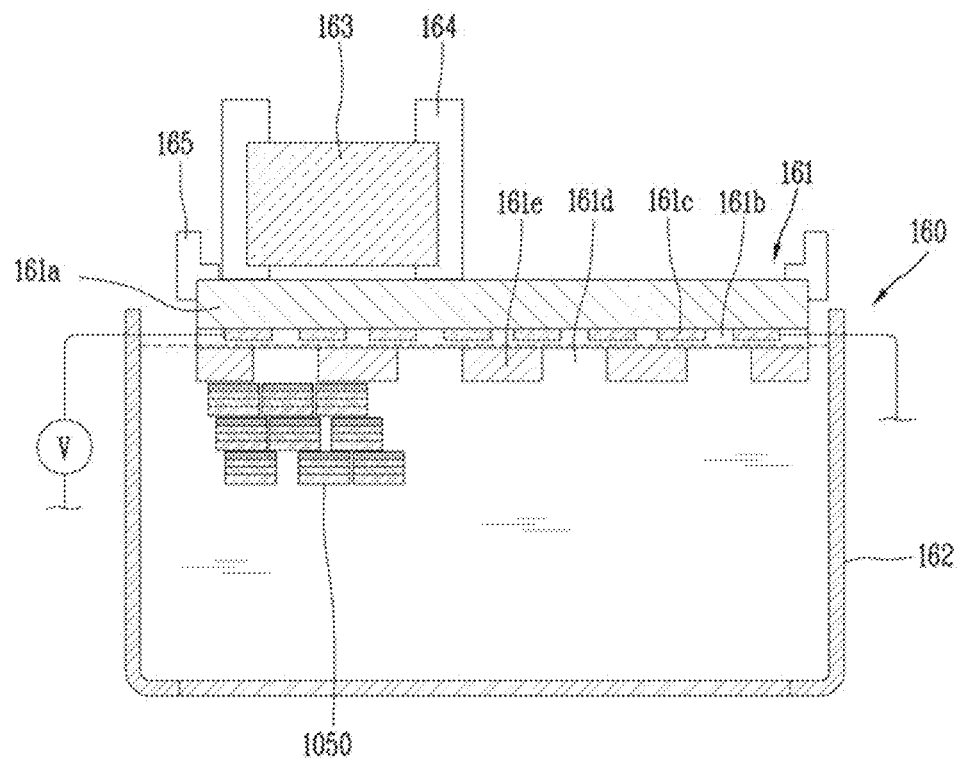

Next, a magnetic force is applied to the semiconductor light-emitting diodes 1050 so that the semiconductor light-emitting diodes 1050 in the assembly chamber 162 come up to the surface (see FIG. 8B).

When the magnets 163 of the self-assembly device move to the opposite side of the assembly surface of the substrate 161 from their original positions, the semiconductor light-emitting diodes 1050 float in the fluid towards the substrate 161. The original positions can refer to positions at which the magnets 163 are outside the assembly chamber 162. In another example, the magnets 163 can be composed of electromagnets. In this case, an initial magnetic force is generated by supplying electricity to the electromagnets.

Meanwhile, in this embodiment, the assembly surface of the substrate 161 and the spacing between the semiconductor light-emitting diodes 1050 can be controlled by adjusting the strength of the magnetic force. For example, the spacing is controlled by using the weight, buoyancy, and magnetic force of the semiconductor light-emitting diodes 1050. The spacing can be several millimeters to several tens of micrometers from the outermost part of the substrate 161.

Next, a magnetic force is applied to the semiconductor light-emitting diodes 1050 so that the semiconductor light-emitting diodes 1050 move in one direction within the assembly chamber 162. For example, the magnets 163 can move in a horizontal, clockwise, or counterclockwise direction to the substrate 161 (see FIG. 8C). In this case, the semiconductor light-emitting diodes 1050 are moved horizontally to the substrate 161 by the magnetic force, spaced apart from the substrate 161.

Figure 8C:
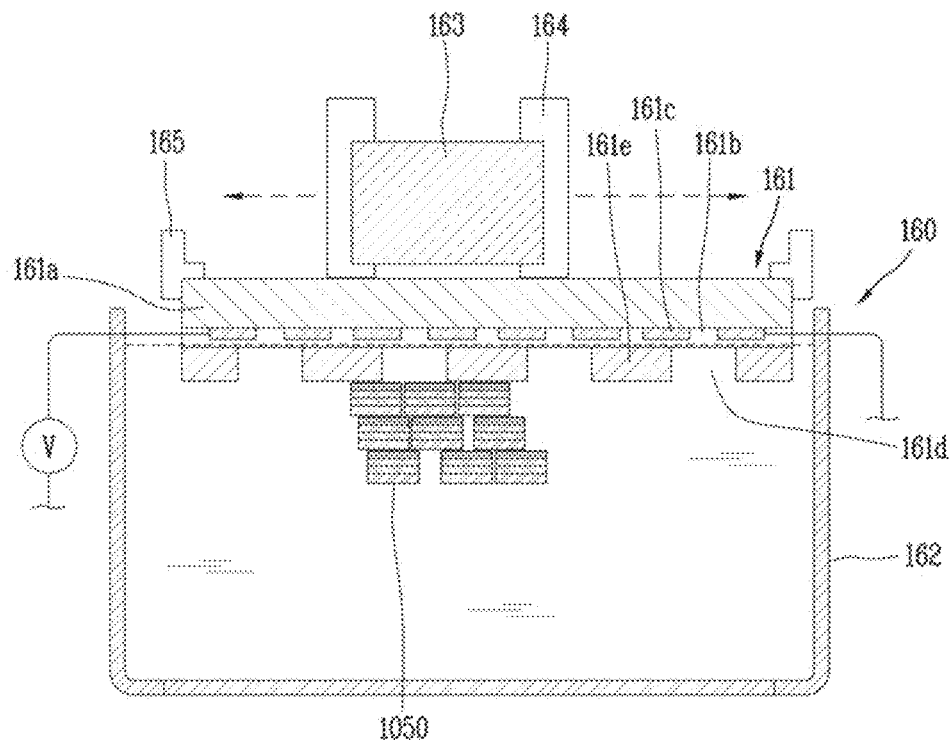

Next, the semiconductor light-emitting diodes 1050 are guided to preset positions on the substrate 161 by applying an electric field so that the semiconductor light-emitting diodes 1050 are mounted at the preset positions while in the process of being moved (see FIG. 8C). For example, the semiconductor light-emitting diodes 1050 are moved vertically to the substrate 161 by the electric field and mounted at preset positions on the substrate 161, while being moved horizontally to the substrate 161.

More specifically, an electric field is generated by supplying power to bi-planar electrodes on the substrate 161, and the semiconductor light-emitting diodes 1050 are guided to the preset positions and assembled only there by the electric field. That is, the semiconductor light-emitting diodes 1050 are self-assembled at an assembly site on the substrate 161 by a selectively generated electric field. To this end, the substrate 161 can be formed with cells into which the semiconductor light-emitting diodes 1050 are fitted.

Afterwards, the unloading of the substrate 161 is performed, thereby completing the assembly process. In a case where the substrate 161 is an assembly substrate, an array of semiconductor light-emitting diodes can be transferred onto a wiring substrate to carry out a subsequent process for realizing the display device, as described previously.

Figure 8D:
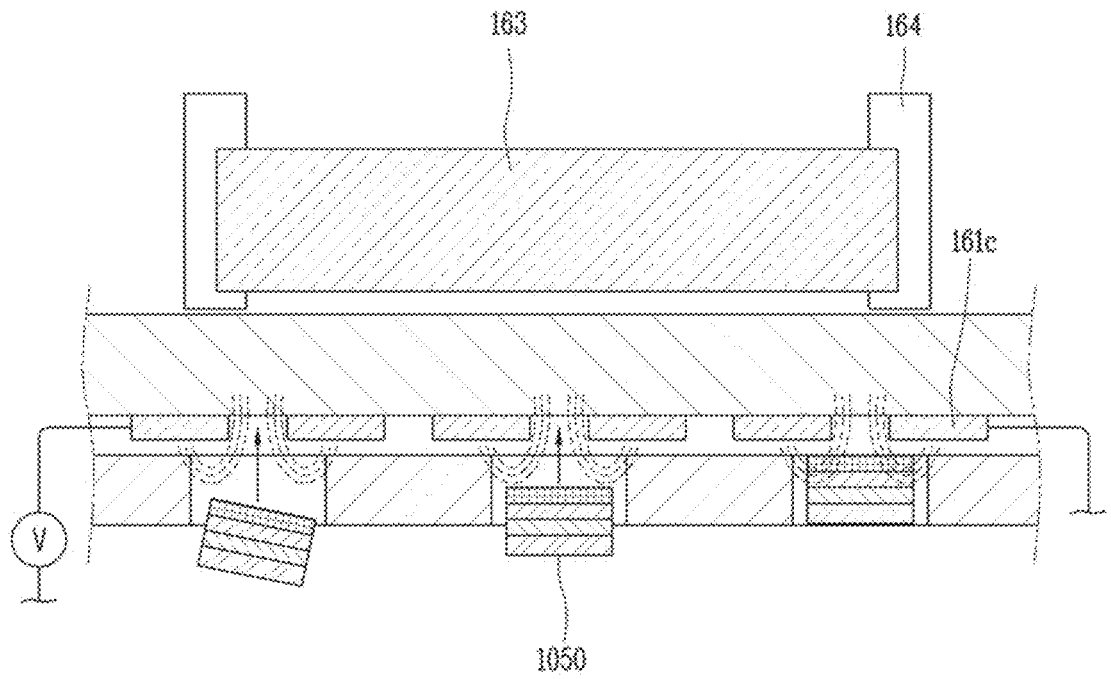
Figure 8E:
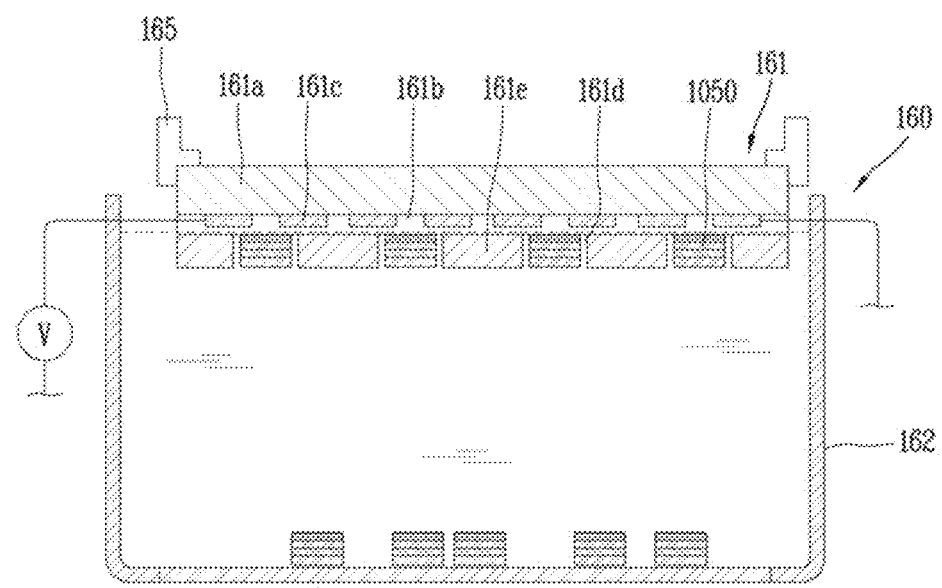

Meanwhile, after the semiconductor light-emitting diodes 1050 are guided to the preset positions, the magnets 163 can be moved in a direction in which they get farther away from the substrate 161, so that the semiconductor light-emitting diodes 1050 remaining in the assembly chamber 162 fall to the bottom of the assembly chamber 162 (see FIG. 8D). In another example, if power supply is stopped in a case where the magnets 163 are electromagnets, the semiconductor light-emitting diodes 1050 remaining in the assembly chamber 162 fall to the bottom of the assembly chamber 162.

Thereafter, the semiconductor light-emitting diodes 1050 on the bottom of the assembly chamber 162 can be collected, and the collected semiconductor light-emitting diodes 1050 can be re-used.

In the above-described self-assembly device and method, parts distant from one another are concentrated near a preset assembly site by using a magnetic field in order to increase assembly yields in a fluidic assembly, and the parts are selectively assembled only at the assembly site by applying an electric field to the assembly site. In this case, the assembly substrate is positioned on top of a water tank, with its assembly surface facing downward, thus minimizing the effect of gravity from the weights of the parts and avoiding non-specific binding and eliminating defects.

As seen from above, with the above configuration according to the present disclosure, large numbers of semiconductor light-emitting diodes can be assembled at a time on a display device where individual pixels are made up of semiconductor light-emitting diodes.

As such, according to the present disclosure, large numbers of semiconductor light-emitting diodes can be pixelated on a small-sized wafer and then transferred onto a large-area substrate. This enables the manufacture of a large-area display device at a low cost.

When the self-assembly process described above is performed, several problems occur.

Firstly, as an area of the display increases, an area of the assembly substrate increases. As the area of the assembly substrate increases, there is a problem that a warpage phenomenon of the substrate increases due to a weight of the assembly substrate. When a self-assembly is performed in a state in which the assembly substrate is warped, since the magnetic field at the surface of the assembly substrate is not uniformly formed or applied, it is difficult to perform the self-assembly stably.

Secondly, since the semiconductor light-emitting diodes may not be completely uniformly dispersed in the fluid and the magnetic field formed at the surface of the assembly substrate may not be uniform completely, a problem that the semiconductor light-emitting diodes are concentrated only at a partial region of the assembly substrate may occur.

The present disclosure provides a self-assembly device capable of solving the above-described problems and increasing a self-assembly yield.

The self-assembly device according to the present disclosure can include a substrate surface treatment part, a substrate chuck 200, a magnetic field forming part 300, a chip supply part 400, and an assembly chamber 500. However, the present disclosure is not limited thereto, and the self-assembly device according to the present disclosure can include more or less components than those described above.

Prior to describing the self-assembly device according to the present disclosure, a method for self-assembly using the self-assembly device according to the present disclosure will be described briefly.

Figure 10:
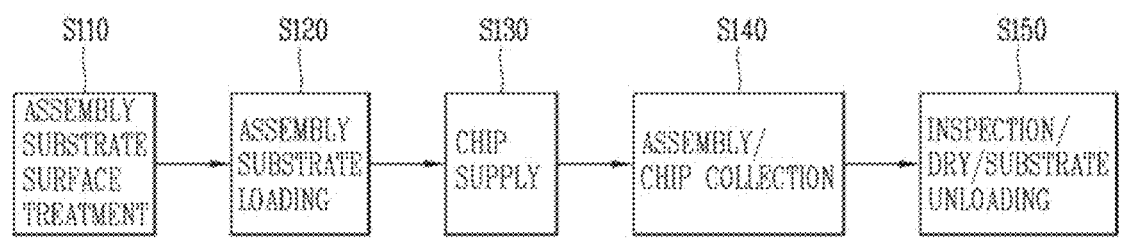
FIG. 10 is a flowchart showing a method for self-assembly according to the present disclosure.

FIG. 10 is a flowchart showing a method for self-assembly according to the present disclosure.

First, a surface treatment step S110 of an assembly substrate is performed. The step is not essential, but when a surface of the substrate is hydrophilized, it is possible to prevent bubbles from being generated on the surface of the substrate.

Next, a step S120 of loading the assembly substrate onto the substrate chuck is performed. The assembly substrate loaded on the substrate chuck 200 is transferred to an assembly position of the assembly chamber. Thereafter, the magnetic field forming part approaches the assembly substrate through vertical and horizontal movements.

In such a state, a step S130 of supplying a chip is performed. Specifically, a step of dispersing the semiconductor light-emitting diode on the assembly surface of the assembly substrate is performed. When the semiconductor light-emitting diode is dispersed near the assembly surface in a state in which the magnetic field forming part 300 is close enough to the assembly substrate, the semiconductor light-emitting diodes adhere to the assembly surface by the magnetic field forming part. The semiconductor light-emitting diodes are dispersed onto the assembly surface at an appropriate dispersion.

However, the present disclosure is not limited thereto, and the semiconductor light-emitting diode can be dispersed into the fluid in the assembly chamber before the substrate is transferred to the assembly position. That is, a time point at which the chip supply step S130 is performed is not limited to after the assembly substrate is transferred to the assembly position.

A method of supplying the semiconductor light-emitting diode can vary according to an area of the assembly substrate, a type of the semiconductor light-emitting diode to be assembled, and a self-assembly speed.

Thereafter, a step S140 of performing the self-assembly and collecting the semiconductor light-emitting diode is performed. The self-assembly will be described later together with a description of a self-assembly device according to the present disclosure. Meanwhile, the semiconductor light-emitting diode is not necessarily collected after the self-assembly. After the self-assembly is completed, the semiconductor light-emitting diode in the assembly chamber is replenished, and then a new substrate can be used to self-assemble the semiconductor light-emitting diode.

Lastly, after the self-assembly is completed, a step S150 of inspecting and drying the assembly substrate, and separating the substrate from the substrate chuck can be performed. The inspection of the assembly substrate can be performed at the position in which the self-assembly has been performed, and can be performed after the assembly substrate is transferred to another position.

Meanwhile, the drying of the assembly substrate can be performed after the assembly substrate is separated from the fluid. After the drying of the assembly substrate, a post process of the self-assembly can be performed.

Contents of a basic principle of the self-assembly, a structure of the substrate (or assembly substrate), and the semiconductor light-emitting diode are replaced with those described in FIGS. 1 to 9. Meanwhile, since a vertical moving part, a horizontal moving part, a rotating part, and other moving means described below can be implemented through several known means such as a motor and a ball screw, a rack gear and a pinion gear, and a pulley and a timing belt, and the like, detailed descriptions thereof will be omitted.

Meanwhile, the controller 172 described in FIG. 7 controls movements of the vertical moving part, the horizontal moving part, the rotating part, and other moving means provided in the above-described components. That is, the controller 172 is configured to control movements of x, y, and z axes and a rotating movement of each component. Even though not mentioned separately in the specification, the movements of the vertical moving part, the horizontal moving part, the rotating part, and other moving means are generated by the control of the controller 172.

Meanwhile, the electrode 161c provided at the substrate (or assembly substrate 161) described in FIGS. 6 to 9 is referred to as an assembly electrode, the assembly electrode 161c is electrically connected to the power supply 171 described in FIG. 7 via the substrate chuck 200, and the power supply 171 supplies power to the assembly electrode 161c by the control of the controller 172. Detailed description thereof will be described later.

Hereinafter, the above-described components will be described.

First, a substrate surface treatment part serves to hydrophilize a substrate surface. Specifically, the self-assembly device according to the present disclosure performs a self-assembly in a state in which the assembly substrate is in contact with a fluid surface. When the assembly surface of the assembly substrate has a heterogeneous property with the fluid surface, bubbles and the like can occur at the assembly surface, and non-specific coupling between the semiconductor light-emitting diode and the assembly surface can occur. To prevent this, the substrate surface can be treated with fluid-friendly properties before the self-assembly.

In one embodiment, when the fluid is a polar material such as water, the substrate surface treatment part can hydrophilize the assembly surface of the substrate.

For example, the substrate surface treatment part can include a plasma generator. Hydrophilic functional groups can be formed at the substrate surface by plasma treatment of the substrate surface. Specifically, the hydrophilic functional groups can be formed at least one of a partition wall and a dielectric layer provided at the substrate by the plasma treatment.

Meanwhile, different surface treatments can be performed at a partition wall surface and a surface of the dielectric layer exposed to the outside by a cell so as to prevent non-specific coupling of the semiconductor light-emitting diode. For example, a hydrophilic treatment can be performed at the surface of the dielectric layer exposed to the outside by the cell, and a surface treatment can be performed to form hydrophobic functional groups at the surface of the partition wall. Accordingly, non-specific coupling of the semiconductor light-emitting diode with respect to the surface of the partition wall can be prevented, and the semiconductor light-emitting diode can be strongly fixed inside the cell.

However, the substrate surface treatment part is not an essential component in the self-assembly device according to the present disclosure. The substrate surface treatment part may not be necessary depending on a material configuring the substrate.

The substrate at which the surface treatment is completed by the substrate surface treatment part is loaded onto a substrate chuck 200.

Next, the substrate chuck 200 will be described.

Figure 11:
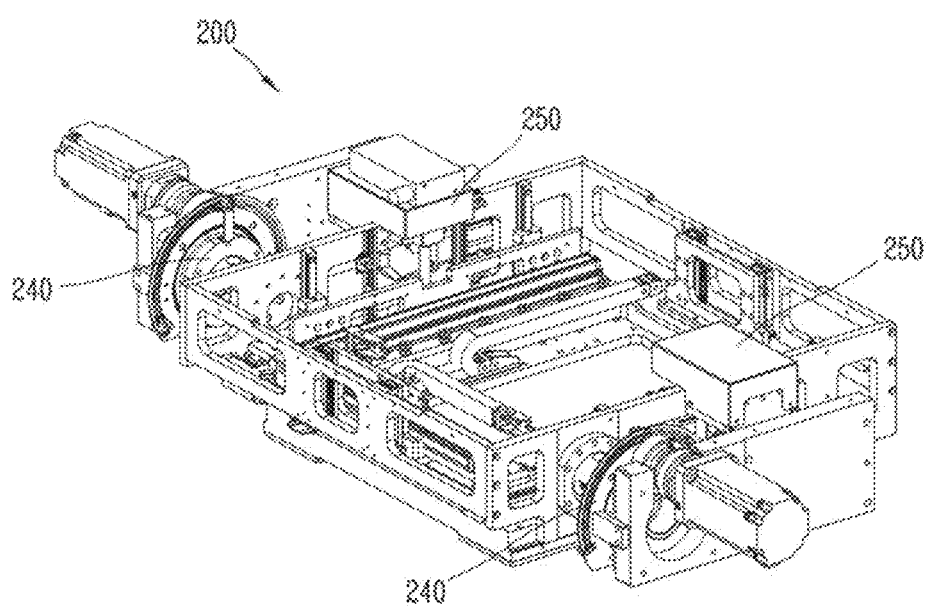
FIG. 11 is a conceptual diagram showing a first state of a substrate chuck.
Figure 12:
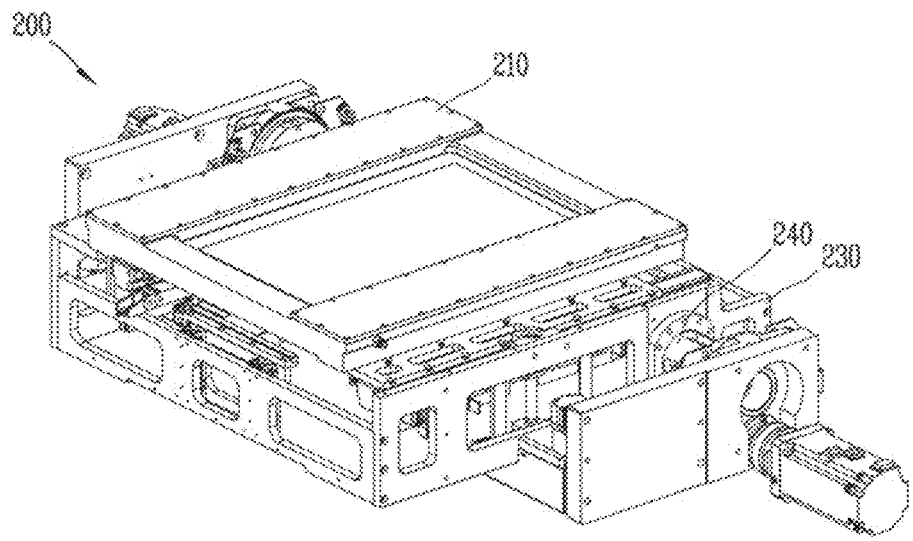
FIG. 12 is a conceptual diagram showing a second state of a substrate chuck.
Figure 13:
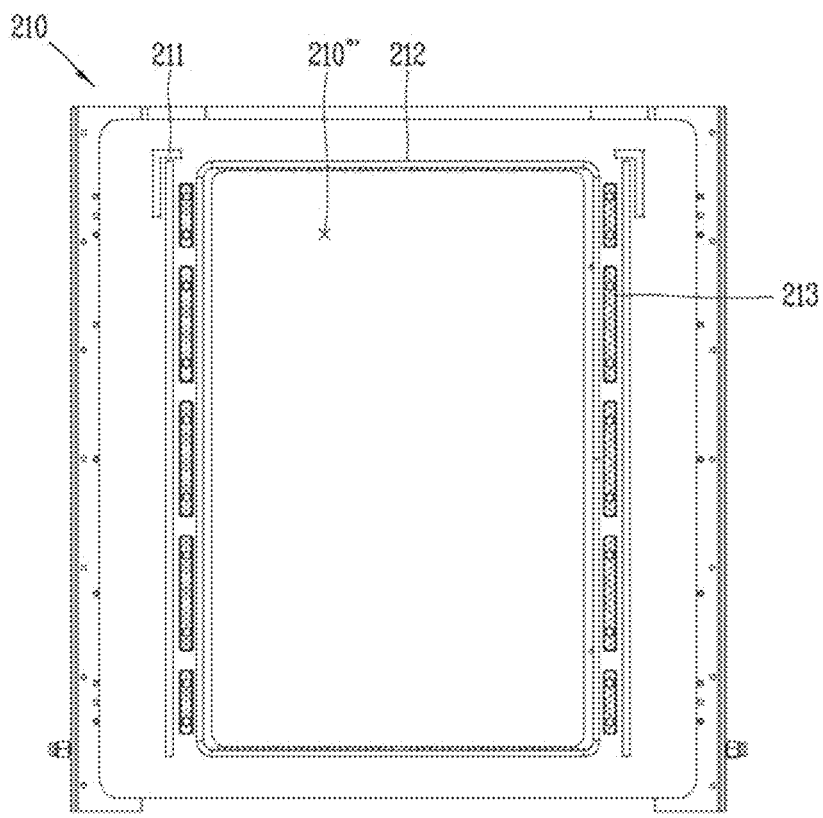
FIG. 13 is a plan view of a first frame provided at a substrate chuck.
Figure 14:
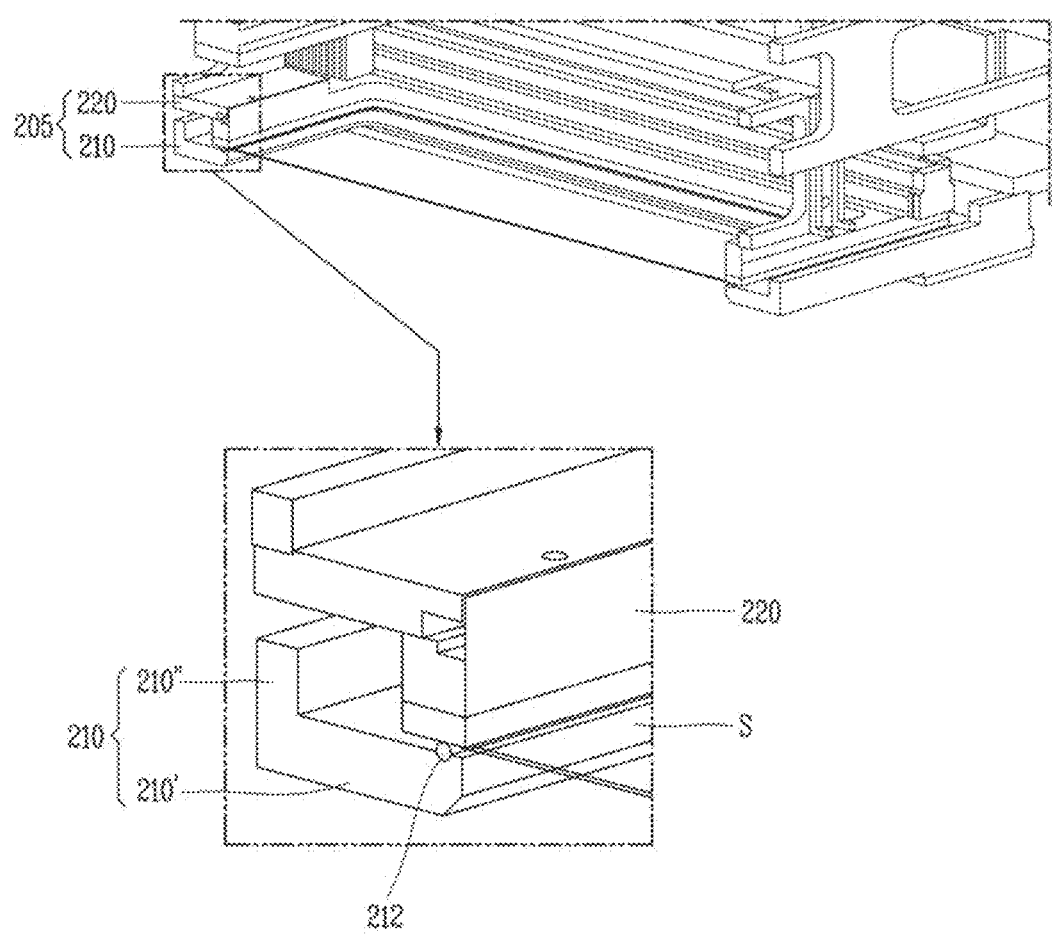
FIG. 14 is a conceptual diagram showing a state in which an assembly substrate is loaded at a substrate chuck.

FIG. 11 is a conceptual diagram showing a first state of a substrate chuck, FIG. 12 is a conceptual diagram showing a second state of the substrate chuck, FIG. 13 is a plan view of a first frame provided at the substrate chuck, and FIG. 14 is a conceptual diagram showing a state in which an assembly substrate is loaded at the substrate chuck.

Referring to the accompanying drawings, the substrate chuck 200 includes a substrate support part 205. In one embodiment, the substrate support part includes first and second frames 210 and 220 and a fixing part 230. The first and second frames 210 and 220 are disposed at upper and lower sides of the loaded substrate interposed therebetween, and the fixing part 230 supports the first and second frames 210 and 220. The substrate chuck 200 can include all of a rotating part 240, a vertical moving part, and a horizontal moving part. As shown in FIG. 11, the vertical moving part and the horizontal moving part 250 can be formed as one device as a moving part 250, but such is not required, and the vertical moving part and the horizontal moving part can be formed separately. Meanwhile, the present disclosure is not limited to drawings described below, and the rotating part, the vertical and horizontal moving parts provided at the substrate chuck can be formed as one device.

In the present specification, the first frame 210 is defined as a frame disposed at a lower side of the substrate in a state in which the assembly surface of the substrate S faces a fluid, and the second frame 220 is defined as a frame disposed at a upper side of the substrate in a state in which the assembly surface of the substrate faces the fluid. The upper and lower sides relation between the first frame 210 and the second frame 220 can be switched with each other due to the rotating part 240. In the present specification, a state in which the first frame 210 is under the second frame 220 is defined as a first state (see FIG. 11), and a state in which the first frame 210 is over the second frame 220 is defined as a second state (see FIG. 12). The rotating part 240 rotates at least one of the first and second frames 210 and 220 and the fixing part 230 to switch from any one of the first and second states to the other. The rotating part 240 will be described later.

The first frame 210 is a frame in contact with the fluid filled in the assembly chamber during self-assembly. Referring to FIG. 14, the first frame 210 includes a bottom portion 210' and a sidewall portion 210".

The bottom portion 210' serves to support the substrate at the lower side or the upper side of the substrate S when the substrate S is loaded. The bottom portion 210' can be formed in one plate shape, or can be formed in a form in which a plurality of members forming a plate shape are coupled to each other. Referring to FIG. 13, the bottom portion 210' includes a hole 210''' passing through a central portion. The hole 210''' can expose a substrate which will be described later to the outside to be in contact with the fluid. That is, the hole 210''' defines the assembly surface of the substrate. The substrate is loaded such that four corners of the rectangular substrate are mounted on an edge of the hole 210''' of the first frame 210. Accordingly, a remaining region except the edge of the substrate is overlapped with the hole 210''' provided at the first frame 210. The region of the substrate overlapped with the hole 210''' becomes an assembly surface. Buoyancy (or upthrust), is a force (e.g., upward) exerted by a fluid that opposes the weight of an immersed object, such as the substrate support part 205. In this context, the hole 210''' is an area of the first frame 210 (e.g., of the bottom portion 210') that does not directly support a surface of the substrate S. Accordingly, when the substrate support part 205 is placed on or partially immersed in the fluid, a force is applied (e.g., by the fluid due to pressure difference between air on one side and the fluid on another side of the substrate S) to a portion of the substrate S that is over the hole 210''', the substrate S becomes pushed (or pulled) so that the substrate S goes from a curved state under its own weight (without support or buoyancy from the fluid) to a flat state (or oppositely curved state) due to support or due to a counter-force to the weight from buoyancy or pressure that is difference from that of the fluid.

Meanwhile, a sealing part 212 and an electrode connection part 213 can be disposed at or adjacent the edge of the hole 210''', and can be arranged parallel to the edge of the hole 210''.

The sealing part 212 is in close contact with the substrate to prevent the fluid filled in the assembly chamber from penetrating into the first and second frames 210 and 220 during self-assembly. In addition, the sealing part 212 prevents the fluid from penetrating into the assembly electrode 161c and the electrode connection part 213. For this, the sealing part 212 should be disposed at a position closer to the hole 210''' than the electrode connection part 213.

The sealing part 212 is formed in a ring shape, and a material of the sealing part 212 is not particularly limited. The material forming the sealing part 212 can be a known sealing material.

The electrode connection part 213 is connected to the assembly electrode formed at the substrate to supply a power to the assembly electrode. In one embodiment, the electrode connection part 213 can apply a power supplied from the power supply 171 described in FIG. 7 to the assembly electrode 161c to form an electric field on the substrate.

Meanwhile, the sidewall portion 210" is formed at an edge of the bottom portion 210'. The sidewall portion 210" prevents the fluid from penetrating into an opposite surface of the assembly surface of the substrate during self-assembly. Specifically, the self-assembly device according to the present disclosure performs self-assembly in a state in which the substrate is submerged in the fluid. The sidewall portion 210" prevents the fluid from penetrating into the opposite surface of the assembly surface of the substrate when the substrate is submerged in the fluid.

For this, the sidewall portion 210" is formed to surround an entire edge of the substrate. A height of the sidewall portion 210" should be greater than a depth at which the substrate is submerged in the fluid. The sidewall portion 210" prevents the fluid from penetrating into the opposite surface of the assembly surface of the substrate, and thus the substrate is prevented from being damaged, and buoyancy of the fluid is applied to only one surface of the substrate. This will be described later.

Meanwhile, the second frame 220 serves to press the substrate at the opposite side of the first frame 210 during self-assembly. Like the first frame 210, the second frame 220 includes a hole passing through a central portion. The hole formed at the second frame 220 is formed to have a size equal to or larger than the hole 210''' formed at the first frame 210.

The hole formed at the second frame 220 allows the opposite surface of the assembly surface of the substrate to be exposed to the outside. The opposite surface of the assembly surface of the substrate should be exposed to the outside in the same area as the assembly surface or in a larger area than the assembly surface. This is because the magnetic field forming part 300 forms a magnetic field at the opposite side of the assembly surface of the substrate. The opposite surface of the assembly surface of the substrate should be exposed to the outside such that the magnetic field forming part 300 can sufficiently approach the substrate.

Meanwhile, the substrate S is loaded between the first and second frames 210 and 220 in the second state. Accordingly, the substrate S is slid and loaded at one surface of the second frame 220. A protrusion for guiding an alignment position of the substrate can be formed at at least one of the first and second frames such that the substrate is aligned to a correct position. In one embodiment, referring to FIG. 13, a protrusion 211 guiding the alignment position of the substrate S can be formed at the first frame 210.

Meanwhile, when the substrate S is loaded on the second frame 220, at least one of the first and second frames 210 and 220 moves vertically such that the first and second frames 210 and 220 press the substrate. For this, the substrate chuck 200 can include a frame moving part disposed at at least one of the fixing part 230, and the first and the second frames 210 and 220. At this time, the sealing part 212 presses the substrate S.

In one embodiment, a frame moving part for vertically moving the second frame 220 can be disposed at the fixing part 230. While the substrate chuck is in the second state, when the substrate S is loaded on the second frame 220, the vertical moving part moves the second frame 220 upwardly such that the substrate S can be strongly fixed between the first and second frames 210 and 220. At this time, the electrode connection part 213 provided at the first frame 210 is connected to the assembly electrode of the substrate S, and the sealing part 212 provided at the first frame 210 presses the edge of the substrate S. In this state, when the substrate chuck switches to the first state, the substrate chuck has a shape as shown in FIG. 14.

However, the present disclosure is not limited thereto, and the frame moving part can be formed so as to move any one of the first and second frames 210 and 220 horizontally with respect to the other. In this case, the frame moving part is formed so as to move any one of the first and second frames 210 and 220 vertically and horizontally with respect to the other. When any one of the first and second frames 210 and 220 can be moved horizontally with respect to the other, a connection part between the electrode connection part 213 and the assembly electrode can be changed. It can be used to detect whether the assembled electrode is defective.

Meanwhile, the rotating part 240 is disposed at one side of the fixing part 230 provided at the substrate chuck 200 described above. The rotating part 240 rotates the fixing part 230 such that the upper and lower-sides relation of the first and second frames 210 and 220 can be switched to each other. The substrate chuck 200 is switched from any one of the first and second states to the other by rotating movement of the rotating part 240. A rotation speed, a degree of rotation, a rotation direction, and the like of the rotating part 240 can be controlled by the controller 172 described in FIG. 7.

In one embodiment, the substrate chuck 200 is in the second state before the substrate S is loaded, and the controller 172 controls the rotating part 240 to rotate the fixing part 230 to 180 degrees after the substrate S is loaded such that the substrate chuck 200 is switched to the first state.

Meanwhile, a vertical moving part and a horizontal moving part are disposed at one side of the fixing part 230.

The horizontal moving part moves at least one of the fixing part 230, and the first and second frames 210 and 220 such that the assembly surface of the substrate can be aligned at an open position of the assembly chamber after the substrate is loaded.

The vertical moving part moves at least one of the fixing part 230, and the first and second frames 210 and 220 such that the vertical distance between the substrate and the assembly chamber is adjusted. A warpage phenomenon of the substrate S can be corrected by the vertical moving part. This will be described later.

In summary, the substrate S is loaded in the second state of the substrate chuck 200 (see FIG. 12). Thereafter, the substrate chuck 200 is switched to the first state (see FIG. 11) and then aligned with the assembly chamber. In this process, the substrate chuck 200 moves vertically and horizontally such that the assembly surface of the substrate S is in contact with the fluid filled in the assembly chamber. Thereafter, the controller 172 controls the magnetic field forming part 300.

Next, the magnetic field forming part 300 will be described.

Figure 15:
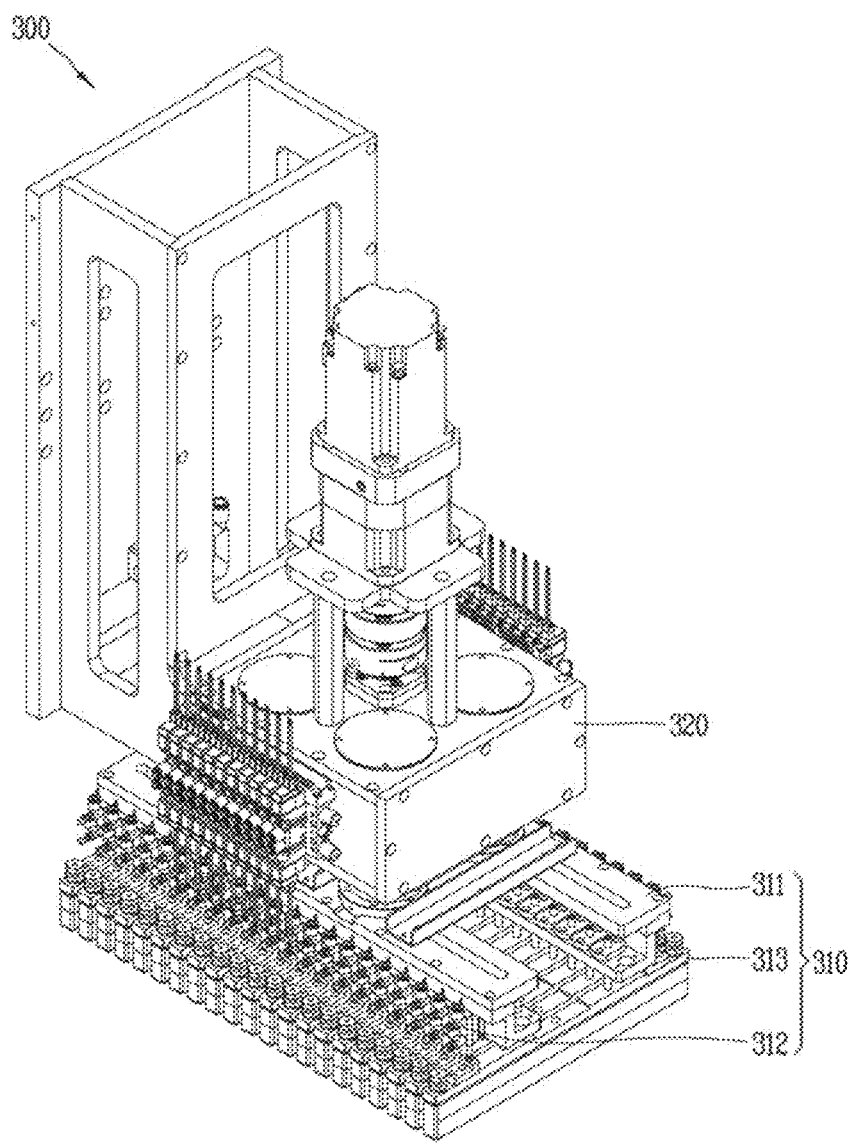
FIG. 15 is a perspective view of a magnetic field forming part according to one embodiment of the present disclosure.
Figure 16:
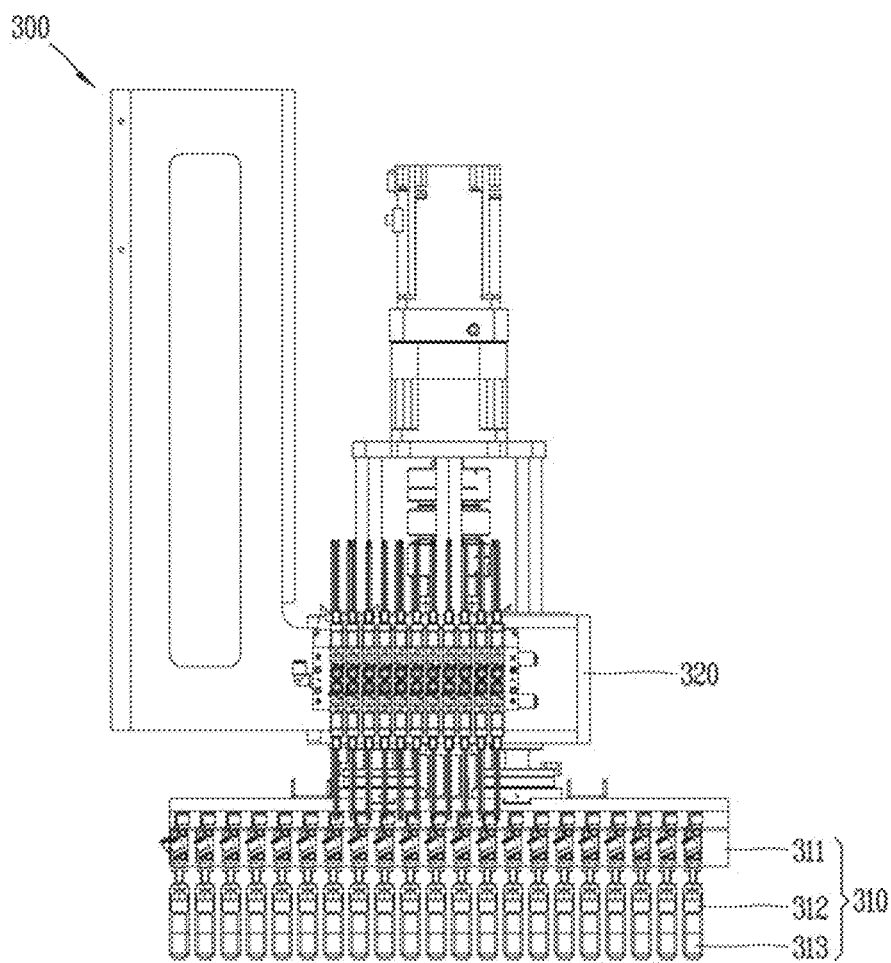
FIG. 16 is one side view of a magnetic field forming part according to one embodiment of the present disclosure.
Figure 17:
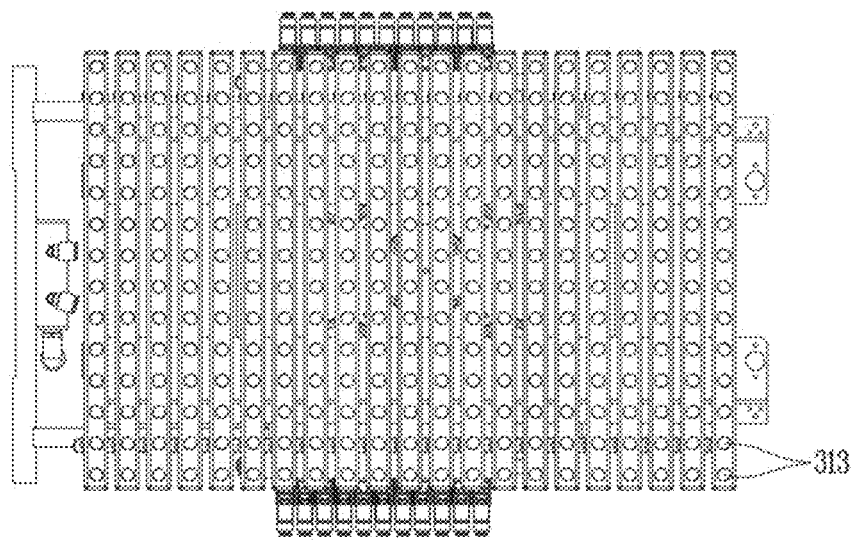
FIG. 17 is a lower side view of a magnetic field forming part according to one embodiment of the present disclosure.
Figure 18:
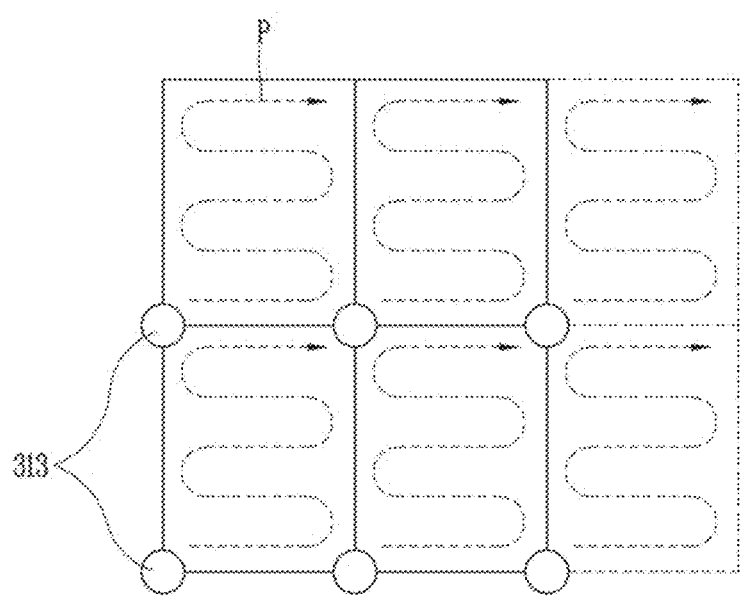
FIG. 18 is a conceptual diagram showing a trajectory of magnets provided at the magnetic field forming part according to the present disclosure.

FIG. 15 is a perspective view of a magnetic field forming part according to one embodiment of the present disclosure, FIG. 16 is one side view of a magnetic field forming part according to one embodiment of the present disclosure, FIG. 17 is a bottom side view of a magnetic field forming part according to one embodiment of the present disclosure, and FIG. 18 is a conceptual diagram showing a trajectory of magnets provided at a magnetic field forming part according to the present disclosure.

Referring to the drawings, the magnetic field forming part 300 includes a magnet array 310, a vertical moving part 320, a horizontal moving part 320, and a rotating part 320. The magnetic field forming part 300 is disposed at an upper side of the assembly electrode to serve to form a magnetic field.

Specifically, the magnet array 310 includes a plurality of magnets 313. The magnet 313 provided at the magnet array 310 can be a permanent magnet or an electromagnet. The magnets 313 serves to form a magnetic field so that the semiconductor light-emitting diodes are led to the assembly surface of the substrate.

The magnet array 310 can include a support part 311 and a magnet moving part 312. The support part 311 is connected to parts 320 that can include a vertical moving part, a horizontal moving part, and a rotating part.

Meanwhile, one end of the magnet moving part 312 is fixed to the support part 311, and the magnet 313 is fixed to the other end of the magnet moving part 312. The magnet moving part 312 is formed to be stretchable in length, and as the magnet moving part 312 is stretched, a distance between the magnet 313 and the support part 311 changes.

As shown in the accompanying drawings, the magnet moving part 312 can be configured to vertically move the magnets 313 disposed in one row at a time. In this case, the magnet moving part 312 can be disposed for each column of the magnet array.

On the other hand, the magnet moving part 312 can be disposed by the number of magnets provided in the magnet array. Accordingly, a distance between each of a plurality of magnets and the support part can be adjusted differently.

The plurality of magnet moving parts serves to adjust finely a gap between the magnet 313 and the substrate S, and when the substrate is warped, serves to adjust uniformly the gaps between the magnets 313 and the substrate S. Self-assembly can be performed in a state in which the magnet 313 is in contact with the substrate S, or can be performed in a state in which the magnet 313 is spaced apart from the substrate S at a predetermined distance.

Meanwhile, the horizontal moving part can include a rotating part. When the self-assembly is performed, the horizontal moving part provided at the magnetic field forming part 300 moves the magnet in one direction and rotates the magnet, simultaneously. Accordingly, the magnet array 310 rotates with respect to a predetermined rotation axis and moves along one direction, simultaneously. For example, referring to FIG. 18, the magnet 313 provided at the magnet array 310 can move while drawing a trajectory P mixed with a curved line and a straight line.

The semiconductor light-emitting diode can be supplied in a state in which the magnetic field forming part 300 is close to the substrate S within a predetermined distance.

Figure 19:
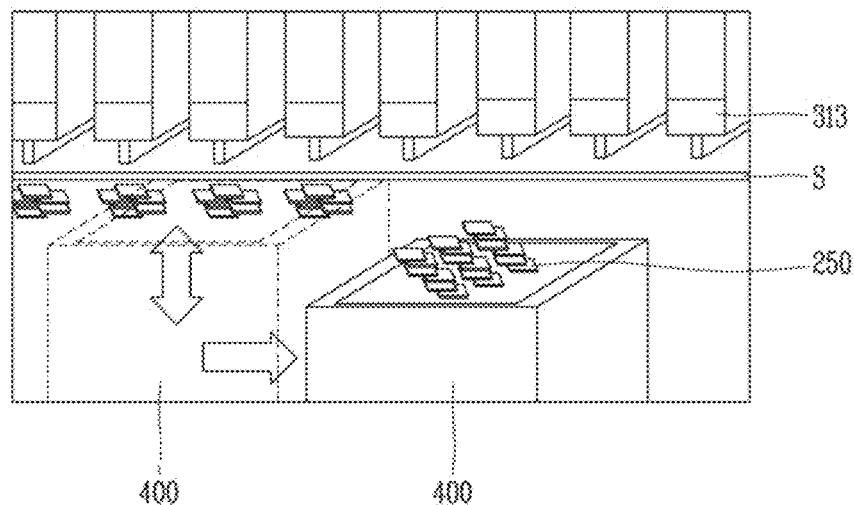
FIG. 19 is a conceptual diagram showing a state in which a semiconductor light-emitting diode is supplied.

FIG. 19 is a conceptual diagram showing a state in which a semiconductor light-emitting diode is supplied.

Referring to FIG. 19, a chip supply part 400 can be disposed in an assembly chamber 500 to be described later. The substrate S is aligned with the assembly chamber 500, and then the chip supply part 400 serves to supply the semiconductor light-emitting diode to the assembly surface of the substrate S. Specifically, the chip supply part 400 can include a chip accommodating part that can accommodate a chip at an upper portion thereof, a vertical moving part, and a horizontal moving part. The vertical and horizontal moving parts allow the chip accommodating part to move in the fluid filled in the assembly chamber.

The plurality of semiconductor light-emitting diodes can be loaded at the chip accommodating part. After the substrate is aligned with the assembly chamber, when the magnetic field forming part 300 is brought close to the substrate within a predetermined distance, a magnetic field of a predetermined intensity or more is formed on the assembly surface. In this state, when the chip accommodating part is brought close to the assembly surface within the predetermined distance, the semiconductor light-emitting diodes loaded at the chip accommodating part are in contact with the substrate. The vertical moving part provided at the chip supply part brings the chip accommodating part close to a partial region of the assembly surface of the substrate within the predetermined distance through vertical movement.

After a predetermined time passes, the vertical moving part provided at the chip supply part allows the chip accommodating part to be separated from the partial region of the assembly surface of the substrate at the predetermined distance or longer through vertical movement. Thereafter, the horizontal moving part provided at the chip supply part moves horizontally the chip accommodating part such that the chip accommodating part is overlapped with a different region from the partial region of the assembly surface. Thereafter, the vertical moving part provided at the chip supply part brings the chip accommodating part close to the different region within the predetermined distance through vertical movement. By repeating such a process, the chip supply part brings the plurality of semiconductor light-emitting diodes into contact with an entire region of the assembly surface of the substrate. Self-assembly can be performed in a state in which the plurality of semiconductor light-emitting diodes are constantly dispersed and in contact with the entire region of the assembly surface of the substrate.

As described above, there are largely two problems in self-assembly. A second problem is that since the semiconductor light-emitting diodes may not be completely uniformly dispersed in the fluid and the magnetic field formed at the surface of the assembly substrate may not be perfectly uniform, there is a problem that the semiconductor light-emitting diodes are concentrated only at a partial region of the assembly substrate. When using the chip supply part 400 described above, it is possible to solve the second problem described above.

However, the present disclosure is not limited thereto, and the chip supply part is not an essential component of the present disclosure. Self-assembly can be performed in a state in which the semiconductor light-emitting diode is dispersed in the fluid, or in a state in which the plurality of semiconductor light-emitting diodes are dispersed and in contact with the assembly surface of the substrate by another part which is not the chip supply part.

Next, the assembly chamber 500 will be described.

Figure 20:
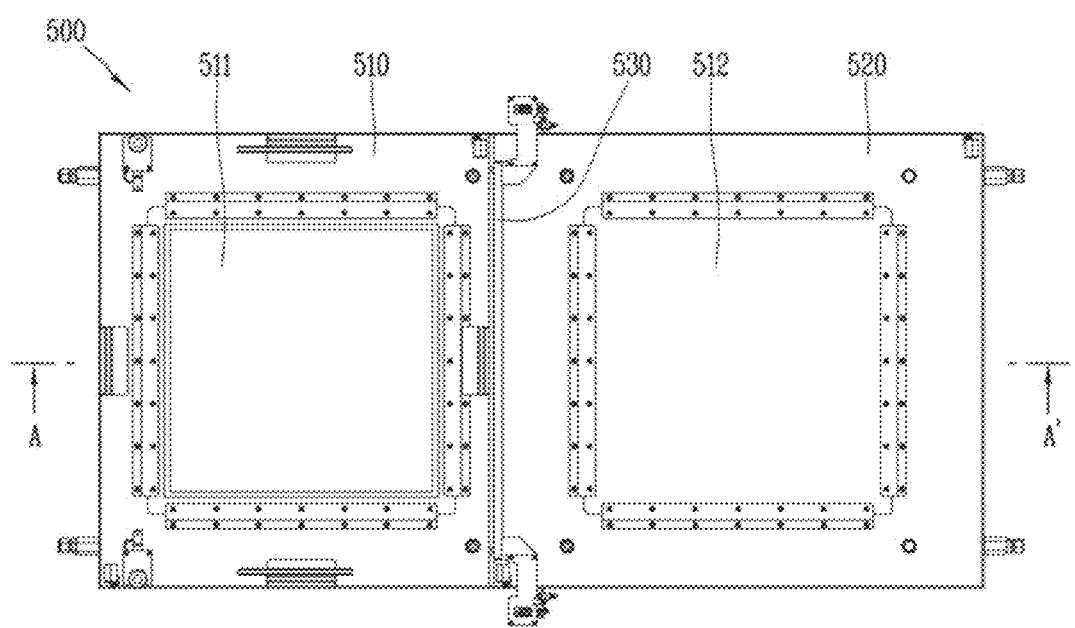
FIG. 20 is a plan view of an assembly chamber according to one embodiment of the present disclosure.
Figure 21:
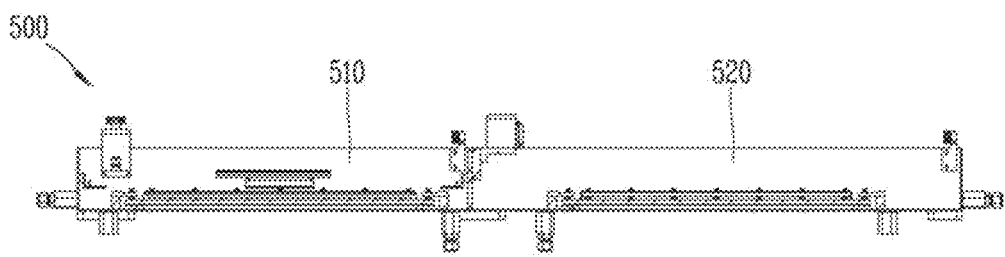
FIG. 21 is a cross-sectional view taken along line A-A' of FIG. 20.
Figure 22:
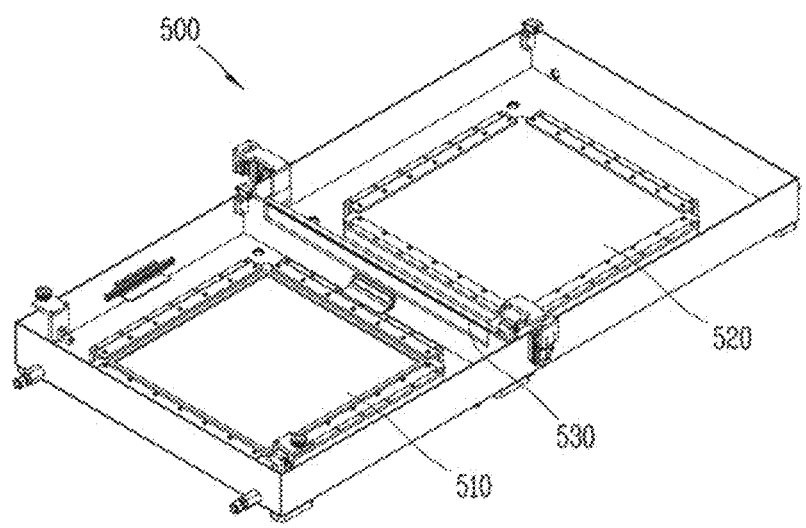
FIGS. 22 and 23 are conceptual views showing movement of a gate provided at an assembly chamber according to one embodiment of the present disclosure.
Figure 23:
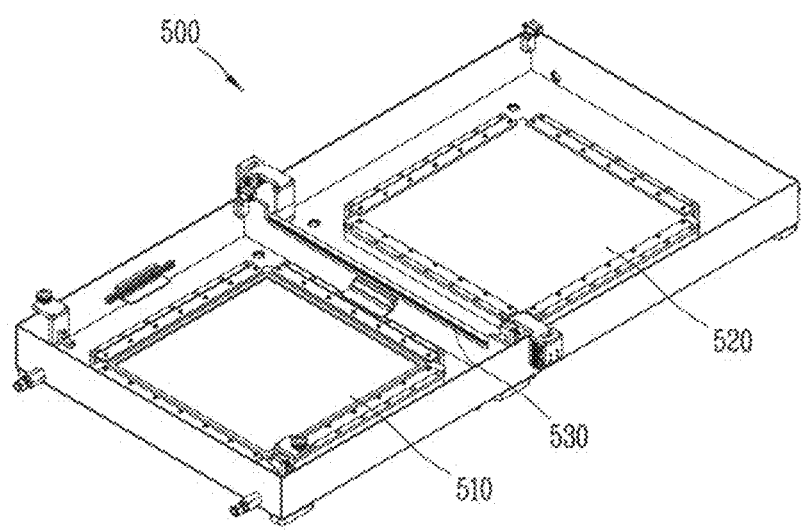

FIG. 20 is a plan view of an assembly chamber according to one embodiment of the present disclosure, FIG. 21 is a cross-sectional view taken along line A-A' of FIG. 20, and FIGS. 22 and 23 are conceptual diagrams showing a movement of a gate provided at an assembly chamber according to one embodiment of the present disclosure.

The assembly chamber 500 includes a space for accommodating a plurality of semiconductor light-emitting diodes. The space can be filled with a fluid, and the fluid can include water, and the like as an assembly solution. Therefore, the assembly chamber 500 can be a water tank, and can be configured as an open type. However, the present disclosure is not limited thereto, and the space of the assembly chamber 500 can be a closed type formed in a closed space.

In the assembly chamber 500, a substrate S is disposed such that an assembly surface at which the semiconductor light-emitting diodes 150 are assembled is faced downwardly. For example, the substrate S is transferred to an assembly position by the substrate chuck 200.

At this time, the assembly surface of the substrate S at the assembly position faces a bottom of the assembly chamber 500. Accordingly, the assembly surface is toward a direction of gravity. The assembly surface of the substrate S is disposed to be submerged in the fluid in the assembly chamber 500.

In one embodiment, the assembly chamber 500 can be divided into two regions. Specifically, the assembly chamber 500 can be divided into an assembly region 510 and an inspection region 520. In the assembly region 510, the semiconductor light-emitting diode disposed in the fluid is assembled to the substrate S in a state in which the substrate S is submerged in the fluid.

On the other hand, in the inspection region 520, the substrate S that has been self-assembled is inspected. Specifically, the substrate S is assembled at the assembly region and then transferred to the inspection region via the substrate chuck.

The same fluid can be filled in the assembly region 510 and the inspection region 520. The substrate can be transferred from the assembly region to the inspection region in a state in which the substrate is submerged in the fluid. When the substrate S disposed in the assembly region 510 is taken out of the fluid, the previously assembled semiconductor light-emitting diode can be separated from the substrate due to surface energy between the fluid and the semiconductor light-emitting diode. For this reason, it is preferable that the substrate is transferred in a state of being submerged in the fluid.

The assembly chamber 500 can include a gate 530 configured to be capable of moving up and down such that the substrate can be transferred in a state of being submerged in the fluid. As shown in FIG. 22, the gate 530 maintains an elevated state (first state) during self-assembly or during substrate inspection, so that the fluid accommodated in the assembly region 510 and the inspection region 520 of the assembly chamber 500 is separated from each other. The gate 530 separates the assembly region and the inspection region, thereby preventing disturbing the inspection of the substrate due to moving of the semiconductor light-emitting diode to the inspection region during self-assembly.

As shown in FIG. 23, when the substrate S is transferred, the gate 530 moves down (second state) to remove a boundary between the assembly region 510 and the inspection region 520. Accordingly, the substrate chuck 200 can transfer the substrate from the assembly region 510 to the inspection region 520 by only horizontal movement without separate vertical movement.

Meanwhile, a sonic generator for preventing agglomeration of the semiconductor light-emitting diode can be disposed at the assembly region 510. The sonic generator can prevent the plurality of semiconductor light-emitting diodes from agglomerating with each other by vibration.

Meanwhile, bottom surfaces of the assembly region 510 and the inspection region 520 can be made of a light transmissive material. In one embodiment, referring to FIG. 20, light transmission regions 511 and 512 can be provided at the bottom surfaces of the assembly region 510 and the inspection region 520, respectively. Accordingly, the present disclosure enables to monitor the substrate during self-assembly, or to perform inspection with respect to the substrate. It is preferable that an area of the light transmission region is larger than that of the assembly surface of the substrate. However, the present disclosure is not limited thereto, and the assembly chamber can be configured to perform self-assembly and inspection at the same position.

When using the substrate chuck 200, the magnetic field forming part 300, and the assembly chamber 500 as described above, the self-assembly described in FIGS. 8A to 8E can be performed. Hereinafter, a detailed structure and method for solving problems caused during self-assembly will be described in detail.

First, a structure and method for solving the most critical problem that occurs during self-assembly will be described. When describing the problem in detail, as an area of a display increases, an area of an assembly substrate increases, and as the area of the assembly substrate increases, a problem that a warpage phenomenon of the substrate increases occurs. When performing self-assembly in a state in which the assembly substrate is warped, since a magnetic field is not uniformly formed at a surface of the assembly substrate, it is difficult to perform the self-assembly stably.

Figure 24:
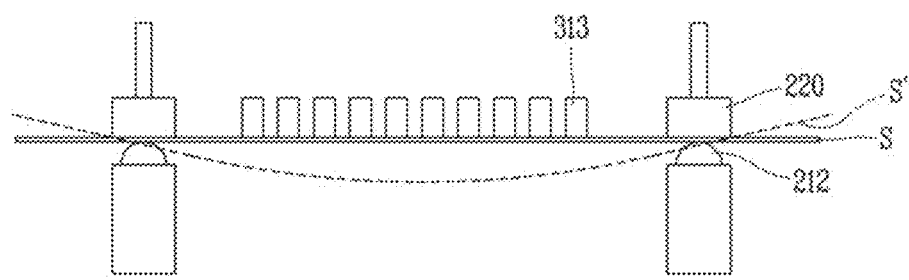
FIG. 24 is a conceptual diagram showing a warpage phenomenon of a substrate generated during self-assembly.

FIG. 24 is a conceptual diagram showing a substrate warpage phenomenon caused during self-assembly.

Referring to FIG. 24, when a substrate S maintains a flat state during self-assembly, a distance between a plurality of magnets 313 and the substrate S can be uniform. In this case, a magnetic field can be formed uniformly at an assembly surface of the substrate. However, when the substrate is actually loaded onto the substrate chuck 200, the substrate is warped due to gravity. In a warped substrate S', since a distance between the plurality of magnets 313 and the substrate S' is not constant, uniform self-assembly is difficult. Since a magnetic field forming part is disposed on an upper side of the substrate, a separate instrument for correcting the warpage phenomenon of the substrate is difficult to be disposed on the upper side of the substrate. In addition, when the separate instrument for correcting the warpage phenomenon of the substrate is disposed on a lower side the substrate, movement of the semiconductor light-emitting diodes can be restricted, and there is a problem that the instrument covers a part of the assembly surface. For this reason, it is difficult to dispose the instrument for correcting the warpage phenomenon of the substrate either on the upper side or the lower side of the substrate.

The present disclosure provides a structure and method of a substrate chuck for correcting a warpage phenomenon of the substrate.

Figure 25:
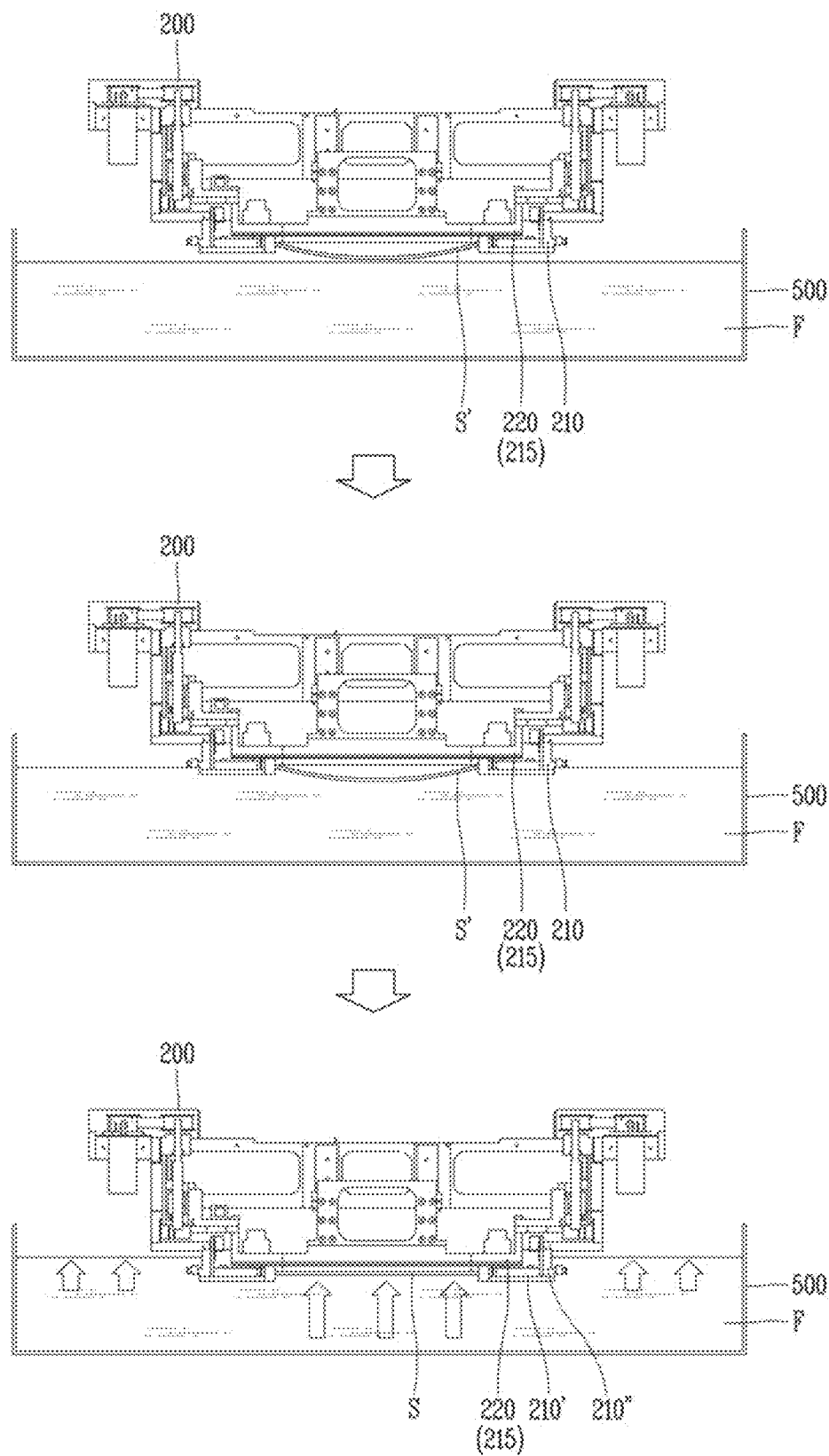
FIG. 25 is a conceptual diagram showing a method for correcting a warpage phenomenon of a substrate.
Figure 26:
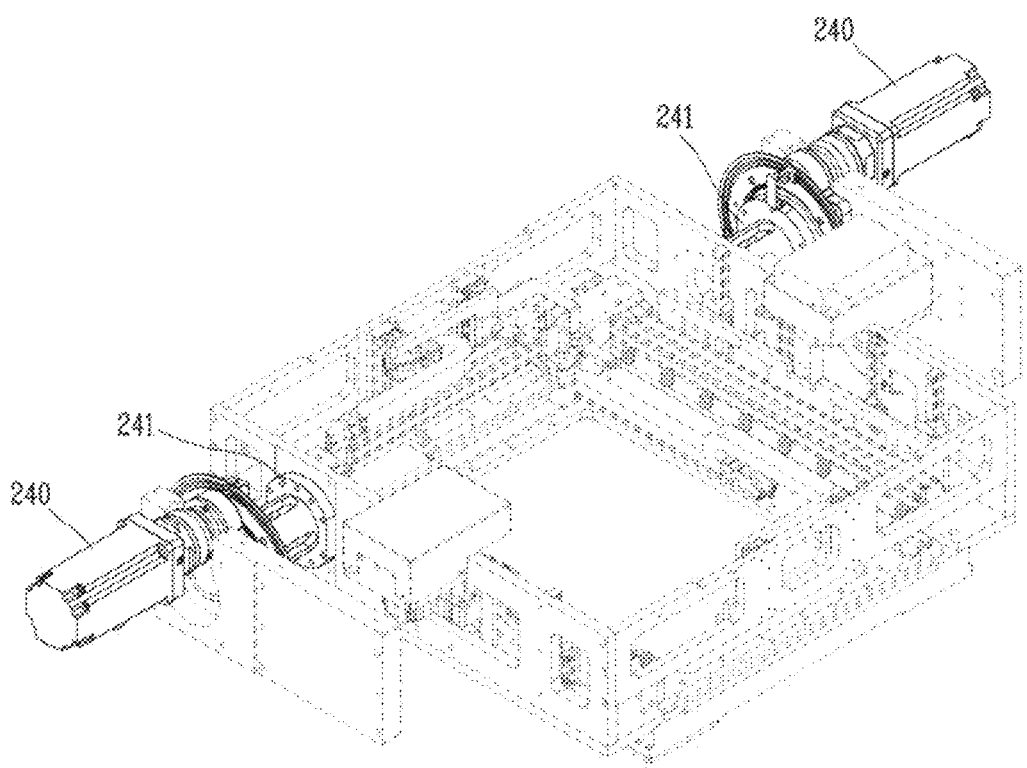
FIGS. 26 to 29 are perspective views of a substrate chuck according to an embodiment of the present disclosure.
Figure 27:
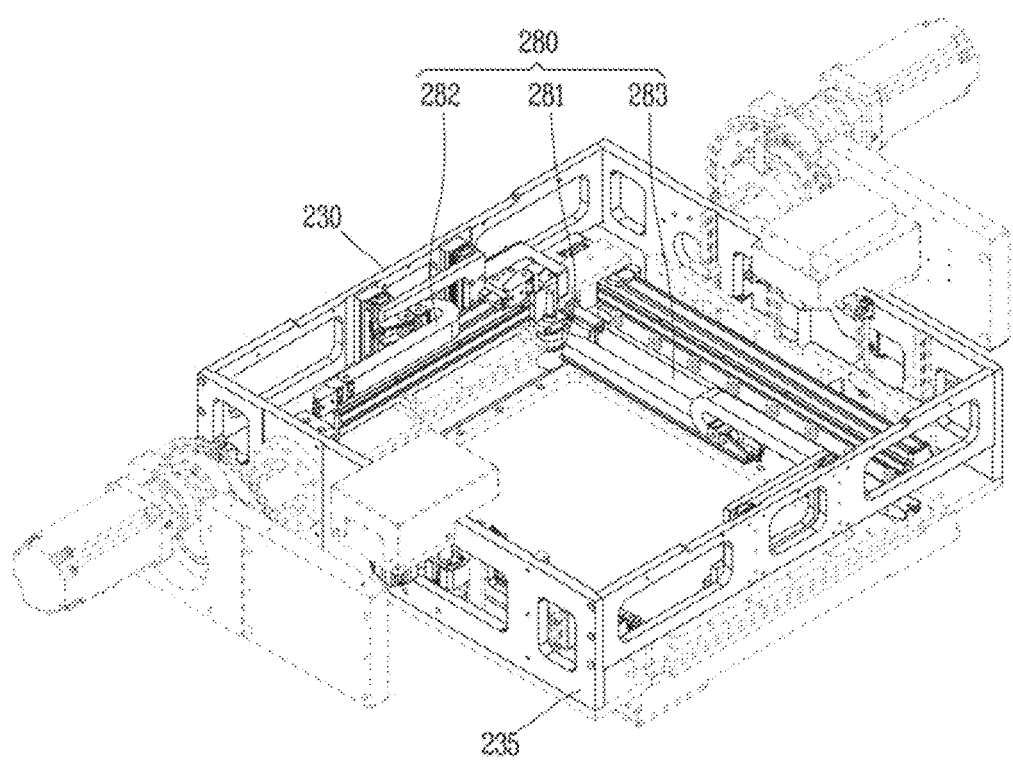
Figure 28:
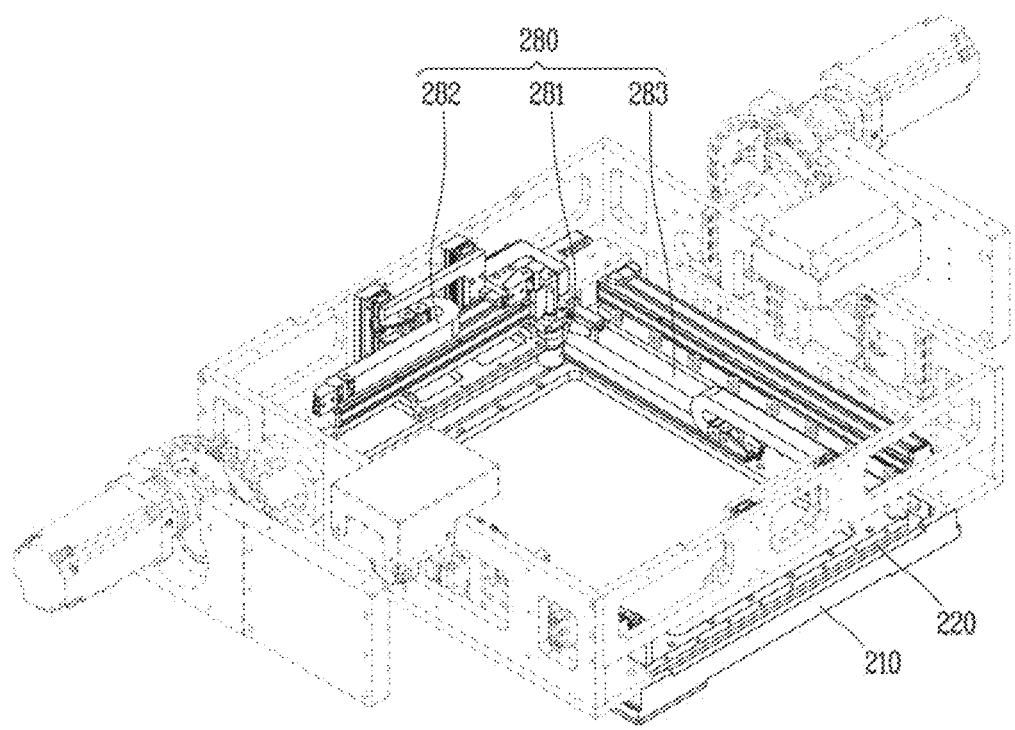

FIG. 25 is a conceptual diagram showing a method for correcting a warpage phenomenon of a substrate.

Referring to FIG. 25, after loading a substrate S' at a substrate chuck 200, when an assembly surface of the substrate faces the gravity direction, the substrate S' is warped. In order to minimize warping of the substrate when loading the substrate, at least one of first and second frames 210 and 220 provided at the substrate chuck applies pressure to all four corners of a rectangular substrate. Nevertheless, when the area of the substrate S' is increased, the substrate is inevitably warped due to gravity.

As shown in the second drawing of FIG. 25, after the substrate chuck 200 is moved to an assembly position, when the substrate chuck 200 is moved down at a predetermined distance, the substrate S' brings into contact with a fluid F. In a state in which the substrate S' is simply in contact with the fluid F, the warpage phenomenon of the substrate S' is not corrected. Although self-assembly can be performed in a state as shown in the second drawing of FIG. 25, it is difficult to perform uniform self-assembly.

The present disclosure further moves down the substrate chuck 200 in the state in which the substrate S' is in contact with the fluid F in order to correct the warpage phenomenon of the substrate. At this time, a sealing part 212 provided at the first frame 210 prevents the fluid F from penetrating into a window of the first frame. In addition, a sidewall portion 210" provided at the first frame 210 prevents the fluid F from flowing over the first frame to an opposite surface of the assembly surface of the substrate S'.

Here, the sealing part 212 should be formed to surround all edges of the substrate. In addition, a height of the sidewall portion 210" should be greater than a depth at which the first frame 210 is moved down to the maximum based on a state in which the first frame 210 is in contact with the fluid F. That is, when the substrate chuck 200 moves down, the fluid should not penetrate over the window and the sidewall portion 210" of the first frame 210.

When the substrate chuck 200 moves down, a surface of the fluid F is raised due to the sealing part 212 and the sidewall portion 210" as described above. At this time, buoyancy by the fluid F acts on the substrate S'. As the surface rising width of the fluid F increases, the buoyancy acting on the substrate S' increases.

In the present disclosure, the buoyancy acting on the substrate can be changed by measuring a degree of warping of the substrate S' and adjusting a descending width of the substrate chuck 200 according to the degree of warping of the substrate. When an appropriate buoyancy is applied to the substrate, as shown in the third drawing of FIG. 25, the substrate S is maintained in a flat state.

The magnetic field forming part 300 is transferred to the upper side of the substrate S in a state in which buoyancy is applied to the substrate S, and then moves horizontally along the substrate S. At this time, power of the power supply 171 is applied to the assembly electrode 161c via the electrode connection part 213. That is, self-assembly proceeds in a state in which buoyancy is applied to the assembly surface of the substrate S.

According to the above description, it is not necessary to dispose separate structures at the upper and lower sides of the substrate, and the warpage phenomenon of the substrate can be corrected. Accordingly, even when an area of the assembly substrate is increased, the present disclosure enables to achieve a high self-assembly yield.

Meanwhile, according to the above-described self-assembly method, the method includes contacting the substrate with the fluid, maintaining the substrate submerged in the fluid, and separating the substrate from the fluid. In the above-described three steps, factors that adversely affect the self-assembly yield can occur. A structure of the substrate chuck that can increase the self-assembly yield by solving the problems that can occur in the above-described three steps will be described.

Figure 29:
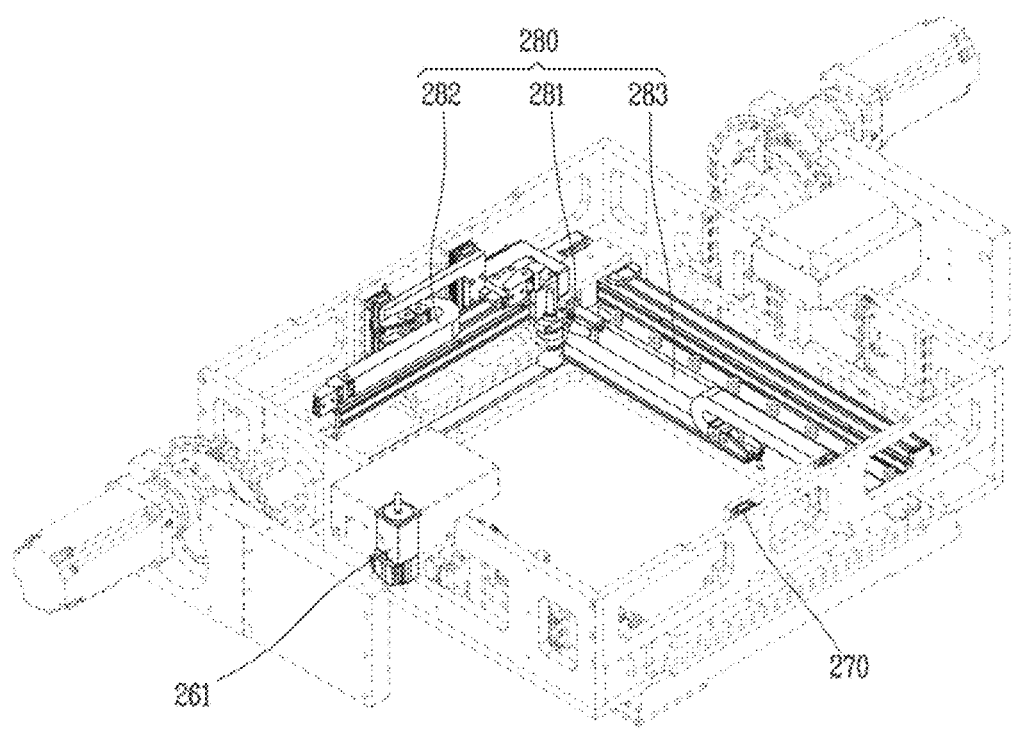
Figure 30:
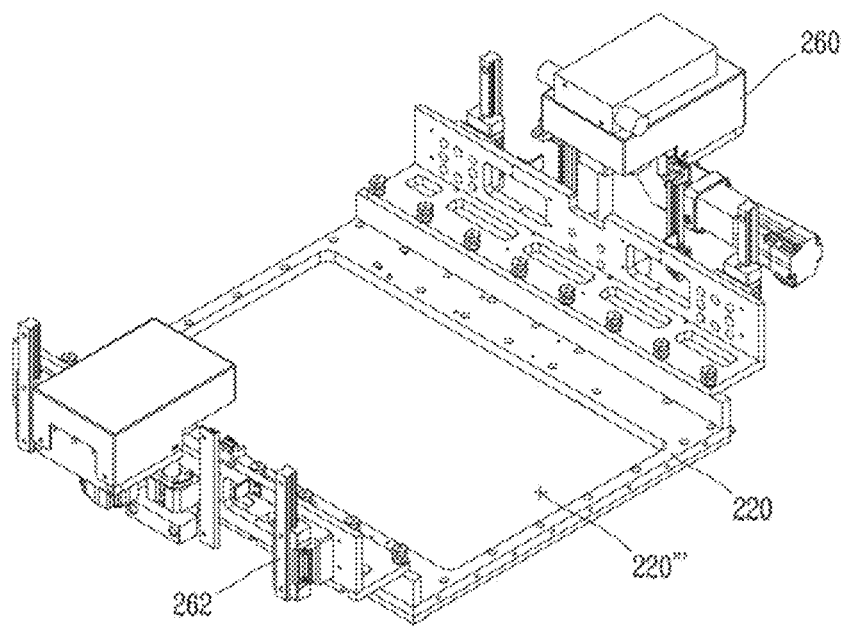
FIG. 30 is a perspective view showing a second frame and a frame transfer part according to an embodiment of the present disclosure.
Figure 31:
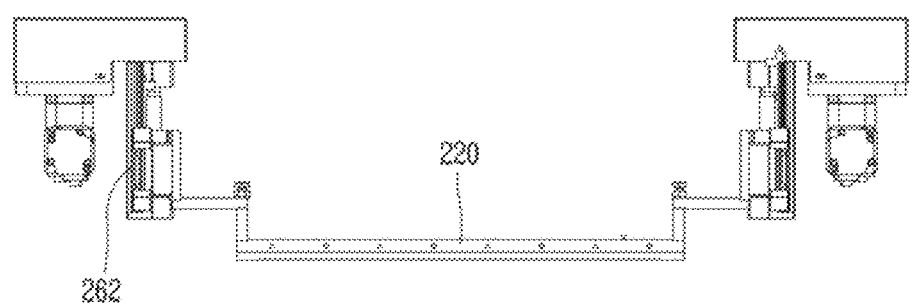
FIG. 31 is one side view showing a second frame and a frame transfer part according to an embodiment of the present disclosure.

FIGS. 26 to 29 are perspective views of a substrate chuck according to an embodiment of the present disclosure, FIG. 30 is a perspective view showing a second frame and a frame transfer part according to an embodiment of the present disclosure, and FIG. 31 is one side view showing a second frame and a frame transfer part according to an embodiment of the present disclosure.

Since the substrate chuck according to the present disclosure can include all the configurations described with reference to FIGS. 11 to 14, the description of the contents described with reference to FIGS. 11 to 14 will be omitted.

Firstly, the rotating part 240 provided at the substrate chuck will be described.

Referring to FIGS. 26 to 29, the rotating part 240 serves to turn over (or flip) the substrate up and down. Although a state in which the semiconductor light-emitting diode is fixed to the substrate is maintained due to the electric field formed at the assembly electrode during self-assembly, but when no voltage is applied to the assembly electrode, the semiconductor light-emitting diode is not fixed to the substrate. That is, when the electric field is applied, the semiconductor light-emitting diode is held to the substrate by a magnetic force, but when there is no electric field due to no voltage being applied, the semiconductor light-emitting diode is no longer held to the substrate, and falls off the substrate.

Since the assembly surface of the substrate is toward a direction of gravity during self-assembly, when no voltage is applied to the assembly electrode in a state in which the self-assembly is completed, the previously assembled semiconductor light-emitting diode is separated from the substrate. As described with reference to FIGS. 11 to 14, since a voltage applied to the assembly electrode is transmitted via the substrate chuck, when the substrate is unloaded from the substrate chuck, the voltage is no longer applied to the assembly electrode. When the substrate is unloaded in a state in which the assembly surface of the substrate is toward the direction of gravity, the assembled semiconductor light-emitting diodes are separated from the substrate.

For the above-described reasons, when the substrate is unloaded after the self-assembly is completed, the assembly surface of the substrate should be toward a direction opposite to gravity. The assembly surface of the substrate toward the direction of gravity can refer to a direction toward the direction opposite to gravity, so that the rotating part 240 serves to prevent the semiconductor light-emitting diode from being separated from the substrate.

The rotating part 240 includes a rotating shaft 241. At least a part of the substrate chuck 200 rotates around the rotating shaft 241. The rotating shaft 241 formed at the substrate chuck 200 according to the present disclosure is disposed at a position spaced apart from a center of the substrate support part at a predetermined distance. More specifically, the rotating shaft 241 is positioned at an end portion of the substrate support part.

In one embodiment, the rotating shaft 241 can be disposed at the fixing part 230 provided at the substrate chuck. The fixing part 230 can include a sidewall part 235, and the rotating shaft 241 can be disposed at an end portion of the sidewall part 235 provided at the fixing part 230.

When the substrate chuck 200 rotates around the rotating shaft 241 positioned at the end portion of the substrate support part, a state in which the substrate loaded at the substrate chuck 200 is obliquely disposed with the ground can be formed. When the substrate is in contact with the fluid and when the substrate is separated from the fluid, the fluid surface and the substrate are obliquely disposed, and thus the present disclosure improves self-assembly yield.

Specifically, when the substrate is in contact with the fluid, the rotating part 240 provided at the substrate chuck 200 rotates only until a state in which the substrate is obliquely disposed with the fluid surface. Thereafter, the vertical moving part provided at the substrate chuck 200 lowers the substrate chuck until one end of the substrate is in contact with the fluid. Thereafter, the rotating part 240 rotates the substrate chuck such that the substrate is sequentially in contact with the fluid along one direction. When the rotating shaft 241 is disposed at a center portion of the substrate support part instead of the end portion thereof, areas of the substrate may not sequentially come in contact with the fluid along one direction. The present disclosure allows the substrate to sequentially come in contact with the fluid along one direction as opposed to the entire surface of the substrate coming into contact with the fluid at once, and thus bubbles formed between the substrate and the fluid are pushed out of the edge of the substrate and removed.

Meanwhile, after the self-assembly is completed, the rotating part 240 rotates the substrate chuck 200 in a direction opposite to the direction when the substrate is in contact with the fluid. Accordingly, the substrate is separated from the fluid in the same trajectory as when the substrate is in contact with the fluid. When the rotating part 240 is disposed at the center portion of the substrate support part, a part of the substrate is additionally submerged in the fluid when the substrate chuck 200 is rotated, and in this process, buoyancy caused by the fluid is applied to the substrate non-uniformly. Therefore, the substrate can be damaged. In the present disclosure, in order to prevent the non-uniform buoyancy from acting on the substrate while the substrate is separated from the fluid after the self-assembly is completed, the rotating shaft 241 is disposed at the end portion of the substrate support part and not at the middle portion of the substrate support part to hold the substrate support part. In various embodiments, the rotating shaft 241 can be disposed at any position from the end portion of the substrate support part to the middle portion of the substrate support part.

As described above, in order to solve the problem that occurs when the substrate is brought into contact with the fluid and when the substrate is separated from the fluid, the present disclosure disposes the rotating part of the substrate chuck at the end portion of the substrate support.

Hereinafter, a structure of the substrate chuck for solving the problem which occurs when the substrate is submerged in the fluid is will be described.

When the substrate is submerged in the fluid, buoyancy due to the fluid is applied to the assembly surface of the substrate. As described with reference to FIGS. 11 to 14, the second frame 220 presses the substrate, and the substrate is in close contact with the sealing part 212 of the first frame 210. Accordingly, even though buoyancy is applied to the assembly surface of the substrate, the fluid does not penetrate between the substrate and the first frame 210.

However, since the buoyancy due to the fluid acts continuously while the substrate is submerged in the fluid, when the sealing between the substrate and the first frame 210 is not complete or tight, the fluid can penetrate or seep between the substrate and the first frame 210. For example, buoyancy acting on a substrate can increase as a depth at which the substrate is submerged in the fluid increases. As a result, the sealing between the substrate and the first frame 210 can be broken or breached, temporarily.

Since the electrode connection part 213 is connected to the edge of the substrate, even a small amount of fluid penetration can have a critical or detrimental effect on a yield of the self-assembly, and a problem can occur that the substrate itself is broken.

The present disclosure has a structure for preventing the substrate from being broken by buoyancy acting on the substrate during self-assembly.

As described above, the present disclosure includes a frame moving part 260 for vertically moving at least one of the first and second frames. In one embodiment, referring to FIG. 29, a motor 261 provided at the frame moving part can be fixed to the fixing part 230 to supply a power to another part. Referring to FIGS. 30 and 31, a guide part 262 is connected to the second frame 220. The guide part 262 receives a power from the motor 261 to move the second frame 220 up and down. However, the present disclosure is not limited thereto, and can include moving means for vertically moving the first frame 210.

After the substrate is loaded between the first and second frames 210 and 220, the frame moving part moves vertically at least one of the first and second frames 210 and 220 so that the first and second frames 210 and 220 press the substrate.

When the substrate is loaded, as described with reference to FIGS. 11 to 14, in order to align the substrate to a correct position, a protrusion 211 guiding an alignment position of the substrate can be formed at at least one of the first and second frames 210 and 220.

After the substrate is aligned to the correct position by using the protrusion 211, the frame moving part moves vertically at least one of the first and second frames 210 and 220. Accordingly, the sealing part 212 provided at the first frame 210 is in contact with an entire edge of one surface (first surface) at which an assembly surface is positioned of both surfaces of the substrate, and the bottom portion provided at the second frame 220 is in contact with an entire edge of the opposite surface (second side) of the one surface at which the assembly surface is positioned of both surfaces of the substrate. Referring to FIG. 30, the bottom portion around the hole 220''' formed at the second frame 220 is in contact with an entire edge of the second surface of the substrate. In various embodiments, the hole 220''' can have a shape that corresponds to a shape of the substrate. For example, the shape of the hole 220''' can be rectangular to match the rectangular shape of the substrate. In other embodiments, the shape of the hole 220''' can vary, and can be circular, oval, square, curved, or any polygon.

Accordingly, the sealing part 212 provided at the first frame 210 is in close contact with an entire edge of the first surface of the substrate, and the second frame 220 presses an entire edge of the second surface of the substrate. In one embodiment, when the substrate has a rectangular plate shape, the sealing part 212 is disposed to surround all four corners of the substrate, and the second frame 220 is configured to press all four corners of the substrate.

The present disclosure allows the second frame 220 to press the entire edge of the substrate, and thus primarily minimizes warpage of the substrate and prevents fluid from penetrating between the substrate and the first frame 210 during self-assembly.

Furthermore, the present disclosure has an additional structure that can protect the substrate during self-assembly.

Specifically, referring to FIG. 29, the present disclosure can further include an auxiliary clamp 270 for fixing the second frame 220 in a state in which the second frame 220 presses the substrate. The auxiliary clamp 270 can be disposed at a sidewall of the fixing part 230.

The auxiliary clamp 270 can be configured to additionally press at least one of the second frame 220 and an edge of the substrate in a state in which the second frame 220 presses the substrate by the frame moving part.

In one embodiment, the auxiliary clamp 270 can be configured to have a cylinder structure. The auxiliary clamp 270 of the cylinder structure is made to be stretchable in a state of being fixed to the sidewall of the fixing part 230, and extends in the direction of the substrate in a state in which the substrate is pressed by the second frame 220 to further press at least one of the second frame 220 and the substrate. However, the type of structure of the auxiliary clamp 270 is not limited thereto.

The frame moving part and the auxiliary clamp utilize any means capable of causing vertical movement of an object, but each of the frame moving part and the auxiliary clamp is preferably made of different means. This is to allow the other to maintain a sealing state between the substrate and the first frame 210 even when a functional problem occurs in any one of the frame moving part and the auxiliary clamp during self-assembly.

For example, the frame moving part can be a vertical moving device using a servomotor, and for example, the auxiliary clamp can be a vertical moving device using a cylinder. However, the present disclosure is not limited thereto.

Meanwhile, at least one of the frame moving part and the auxiliary clamp can increase the pressure for pressing the substrate in proportion to a depth at which the substrate is submerged in the fluid. For example, the frame moving part can increase the pressure for pressing the substrate in proportion to a depth at which the substrate is further lowered based on a state in which the substrate is in contact with the fluid.

As described above, the present disclosure prevents the substrate from being damaged due to buoyancy acting on the substrate during self-assembly.

In addition, a device capable of sensing the degree of bending of the substrate can be disposed at the substrate chuck 200. Specifically, referring to FIG. 29, a sensor module 280 for measuring a distance to a measurement target object is disposed in the fixing part 230.

The sensor module 280 includes a displacement sensor 281 and sensor transfer parts 282 and 283.

The displacement sensor 281 is moved by the sensor transfer parts 282 and 283 disposed at a sidewall part of the fixing part. The sensor transfer parts 282 and 283 allow the displacement sensor 281 to move in X and Y axis directions, respectively. The displacement sensor 281 performs horizontal movement with respect to the substrate based on a reference plane defined by the sensor transfer parts 282 and 283 and measures a distance between the substrate and the displacement sensor 281.

As described above, the substrate chuck 200 according to the present disclosure not only serves to support and transfer the substrate, but also improves self-assembly yield and prevents the substrate from being damaged.

The above-described disclosure is not limited to the configuration and method of embodiments described above, and the above embodiments can be configured by selectively combining all or part of each of embodiments such that various modifications can be performed.

What is claimed is:

1. A substrate chuck used for placing semiconductor light-emitting diodes dispersed in a fluid at predetermined positions of a substrate, the substrate chuck comprising:
    a substrate support part for supporting the substrate having an assembly electrode;
    a vertical moving part which moves the substrate so that one surface of the substrate comes in contact with the fluid in a state in which the substrate is supported by the substrate support;
    an electrode connection part configured to apply power to the assembly electrode to generate an electric field so that the semiconductor light-emitting diodes are placed at the predetermined positions of the substrate in a process of moving the semiconductor light-emitting diodes by a position change of at least one magnet; and
    a rotating part configured to rotate the substrate support part around a rotating shaft so that the substrate is placed in an upward or downward direction,
    wherein the rotating shaft is spaced apart from a center of the substrate support part at a predetermined distance,
    wherein the substrate support part comprises:
        first and second frames for fixing the substrate from opposite directions; and
        a fixing part having a sidewall part for fixing the first and second frames thereto, and
    wherein the rotating shaft is disposed at one end of the sidewall part of the fixing part.

2. The substrate chuck of claim 1, wherein a protrusion for guiding an alignment position of the substrate is formed at at least one of the first and second frames.

3. The substrate chuck of claim 2, wherein each of the first and second frames comprises:
    a bottom portion in contact with the substrate; and
    a hole disposed in a center of the bottom portion and exposing the one surface of the substrate to the outside.

4. The substrate chuck of claim 3, wherein the bottom portion provided at the second frame is formed to be in contact with an entire edge of the one surface among opposite surfaces of the substrate in a state in which the first and second frames press on the substrate.

5. The substrate chuck of claim 4, further comprising:
    a sealing part disposed at the bottom portion of the first frame,
    wherein the sealing part is formed to be in contact with an entire edge of another surface among opposite surfaces of the substrate in the state in which the first and second frames press on the substrate.

6. The substrate chuck of claim 1, further comprising:
    a frame moving part disposed at the fixing part and vertically moving at least one of the first and second frames so that the first and second frames press on the substrate from opposite sides in a state in which the substrate is loaded on the substrate chuck.

7. The substrate chuck of claim 6, further comprising:
    an auxiliary clamp for fixing at least one of the second frame and the substrate in a state in which the second frame presses on the substrate.

8. The substrate chuck of claim 6, further comprising:
    a displacement sensor disposed at the fixing part and measuring a distance from the substrate to the displacement sensor; and
    a sensor transfer part disposed at the sidewall part of the fixing part and horizontally moving the displacement sensor with respect to the substrate.

9. The substrate chuck of claim 1, wherein the rotating shaft is positioned at an end portion of the substrate support part.

10. A substrate chuck used for placing semiconductor light-emitting diodes dispersed in a fluid at predetermined positions of a substrate, the substrate chuck comprising:
    a substrate support for supporting the substrate;
    a mover which moves the substrate so that one surface of the substrate is able to come in contact with the fluid while the substrate is supported by the substrate support; and
    a rotator for rotating the substrate support around a rotating shaft so that the one surface of the substrate is placed in an upward or downward direction,
    wherein the rotating shaft is spaced apart from a center of the substrate support by a predetermined distance,
    wherein the substrate support comprises:
        a first frame and a second frame for fixing the substrate from opposite directions; and
        a fixing part having a sidewall part, wherein the first frame and the second frame are attached to the sidewall part, and
    wherein the rotating shaft is disposed at one end of the sidewall part of the fixing part.

11. The substrate chuck of claim 10, further comprising:
    a frame moving part disposed at the fixing part and vertically moving at least one of the first frame and the second frame so that the first and second frames press on the substrate from opposite sides when the substrate is loaded on the substrate chuck.

12. The substrate chuck of claim 11, wherein each of the first frame and the second frame comprises:
    a bottom portion in contact with the substrate; and
    a hole disposed at the bottom portion and to expose the one surface of the substrate.

13. The substrate chuck of claim 12, wherein the bottom portion provided at the second frame is formed to be in contact with an entire edge of the one surface among opposite surfaces of the substrate when the first frame and the second frame press on the substrate.

14. The substrate chuck of claim 12, further comprising:
a sealing part disposed at the bottom portion of the first frame,
wherein the sealing part is formed to be in contact with an entire edge of another surface among opposite surfaces of the substrate when the first frame and the second frame press on the substrate.

15. The substrate chuck of claim 10, wherein the rotating shaft is positioned at an end portion of the substrate support.

16. The substrate chuck of claim 10, further comprising a protrusion for guiding an alignment position of the substrate formed at at least one of the first frame and the second frame.

17. The substrate chuck of claim 10, further comprising:
an auxiliary clamp for fixing at least one of the second frame and the substrate when the second frame presses on the substrate.

18. A substrate chuck used for placing semiconductor light-emitting diodes dispersed in a fluid at predetermined positions of a substrate, the substrate chuck comprising:
a substrate support for supporting the substrate;
a mover which moves the substrate so that one surface of the substrate is able to come in contact with the fluid while the substrate is supported by the substrate support; and
a rotator for rotating the substrate support around a rotating shaft so that the one surface of the substrate is placed in an upward or downward direction,
wherein the rotating shaft is spaced apart from a center of the substrate support by a predetermined distance,
wherein the substrate includes an assembly electrode, and
wherein the substrate chuck further comprises an electrode connection part for applying power to the assembly electrode to generate an electric field so that the semiconductor light-emitting diodes are placed at the predetermined positions of the substrate by change of positions of least one magnet to move the semiconductor light-emitting diodes to the predetermine positions.

* * * * *